(12) United States Patent
Minami et al.

(10) Patent No.: US 9,755,168 B2
(45) Date of Patent: Sep. 5, 2017

(54) DISPLAY APPARATUS AND ELECTRONIC APPARATUS

(71) Applicant: JOLED Inc., Tokyo (JP)

(72) Inventors: Tetsuo Minami, Tokyo (JP); Katsuhide Uchino, Kanagawa (JP)

(73) Assignee: JOLED Inc., Tokyo (JP)

( * ) Notice: Subject to any disclaimer, the term of this patent is extended or adjusted under 35 U.S.C. 154(b) by 0 days.

(21) Appl. No.: 15/430,731

(22) Filed: Feb. 13, 2017

(65) Prior Publication Data

US 2017/0155066 A1  Jun. 1, 2017

Related U.S. Application Data

(63) Continuation of application No. 13/302,624, filed on Nov. 22, 2011, now Pat. No. 9,608,215.

(30) Foreign Application Priority Data

Dec. 13, 2010  (JP) .................................. 2010-276940

(51) Int. Cl.
*G06F 1/00* (2006.01)
*H01L 51/00* (2006.01)
(Continued)

(52) U.S. Cl.
CPC ...... *H01L 51/0097* (2013.01); *H01L 27/3276* (2013.01); *H01L 51/5237* (2013.01);
(Continued)

(58) Field of Classification Search
CPC .......... G06F 1/00; G06F 3/0412; G06F 3/041; G06F 3/00; G06F 3/0416; G06F 1/1652;
(Continued)

(56) References Cited

U.S. PATENT DOCUMENTS 6,426,594 B1  7/2002  Ito
2003/0227441 A1  12/2003  Hioki et al.
(Continued)

FOREIGN PATENT DOCUMENTS

JP  06-194680  7/1994
JP  2000-231112 A  8/2000
(Continued)

OTHER PUBLICATIONS

Japanese Office Action issued Jul. 29, 2014 for corresponding Japanese Application No. 2010-276940.

*Primary Examiner* — Michael Faragalla
(74) *Attorney, Agent, or Firm* — Michael Best & Friedrich LLP

(57) ABSTRACT

Disclosed herein is a display apparatus, including: a foldable substrate; a pixel array section including a plurality of pixels disposed on the substrate and each including an electro-optical device; the foldable substrate being folded at a substrate end portion at least on one side thereof around the pixel array section; a peripheral circuit section disposed on the substrate end portion and adapted to drive the pixels of the pixel array section; and a pad section provided on the substrate end portion on which the peripheral circuit section is provided and adapted to electrically connect the peripheral circuit section to the outside of the substrate.

4 Claims, 24 Drawing Sheets

(51) Int. Cl.
  *H01L 27/32* (2006.01)
  *H01L 51/52* (2006.01)
  *G09G 3/3225* (2016.01)
(52) U.S. Cl.
  CPC ....... *G09G 3/3225* (2013.01); *G09G 2380/02* (2013.01); *H01L 2251/5338* (2013.01)
(58) Field of Classification Search
  CPC ........... G02F 1/13452; G02F 1/133308; G02F 1/13338
  See application file for complete search history.

(56) References Cited

U.S. PATENT DOCUMENTS

| | | |
|---|---|---|
| 2009/0102760 A1 | 4/2009 | Yamashita et al. |
| 2009/0200937 A1 | 8/2009 | Sagawa |
| 2011/0007042 A1* | 1/2011 | Miyaguchi ........ G02F 1/133305 345/204 |
| 2012/0056859 A1 | 3/2012 | Chen et al. |

FOREIGN PATENT DOCUMENTS

| | | |
|---|---|---|
| JP | 2007-114496 A | 5/2007 |
| JP | 2008-283222 A | 11/2008 |
| JP | 2009-103868 | 5/2009 |
| JP | 2011-034066 A | 2/2011 |
| JP | 10-115837 | 5/2014 |
| KR | 2008-0092848 A | 10/2008 |
| WO | WO-2010/070735 A1 | 6/2010 |

* cited by examiner

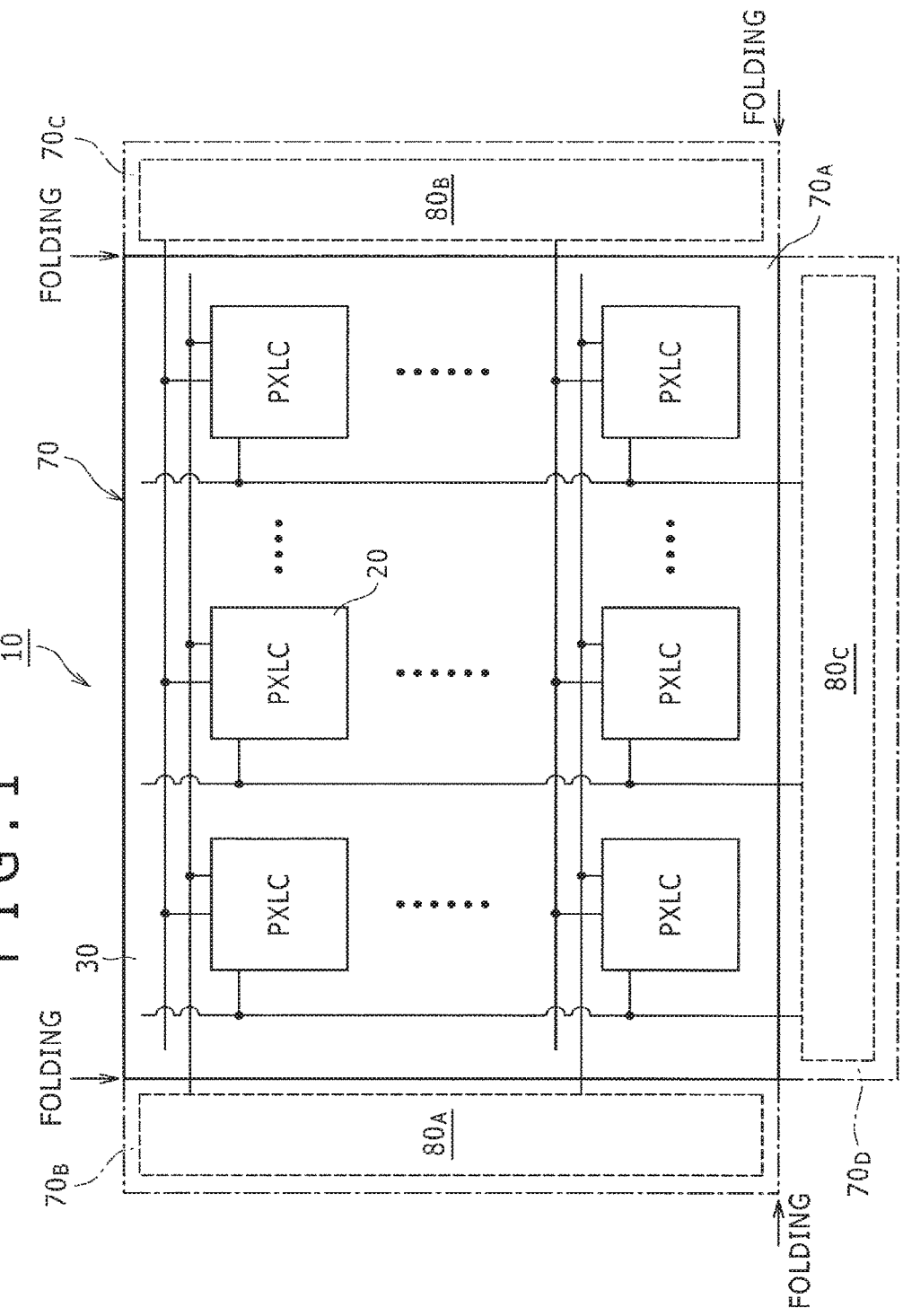

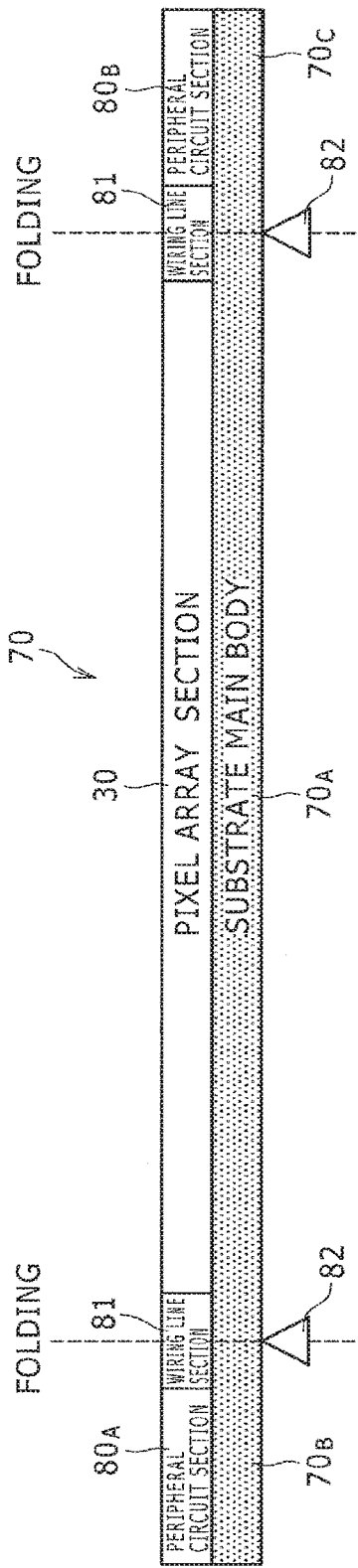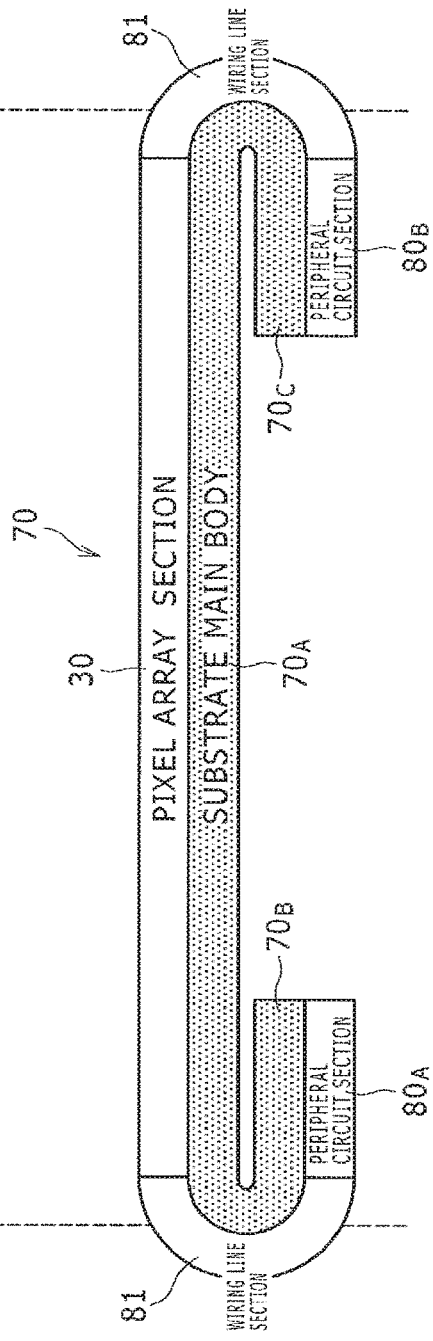

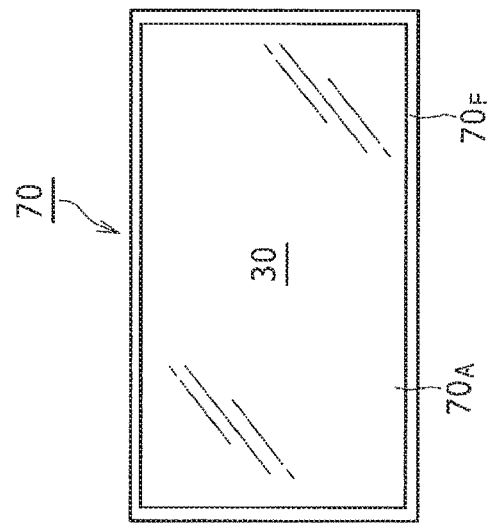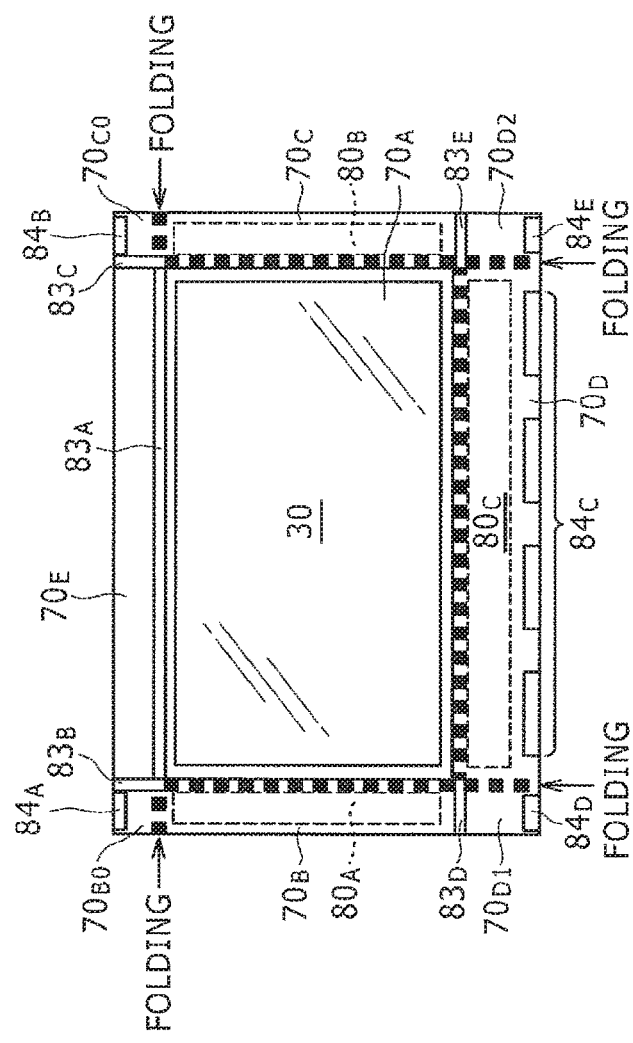

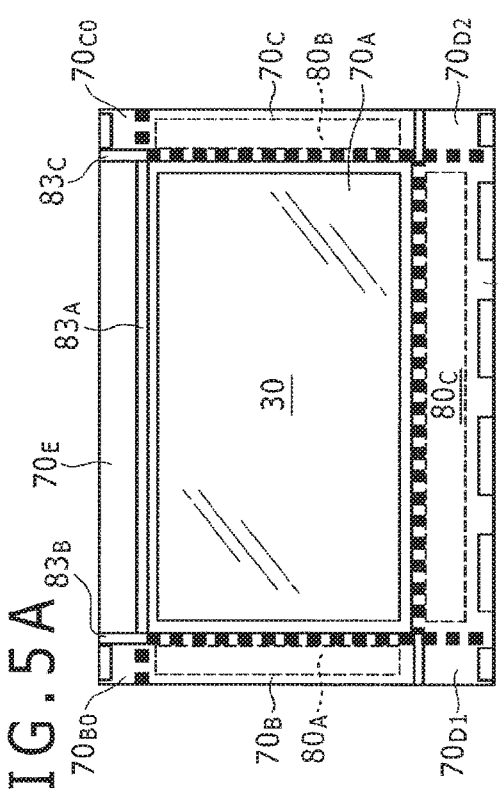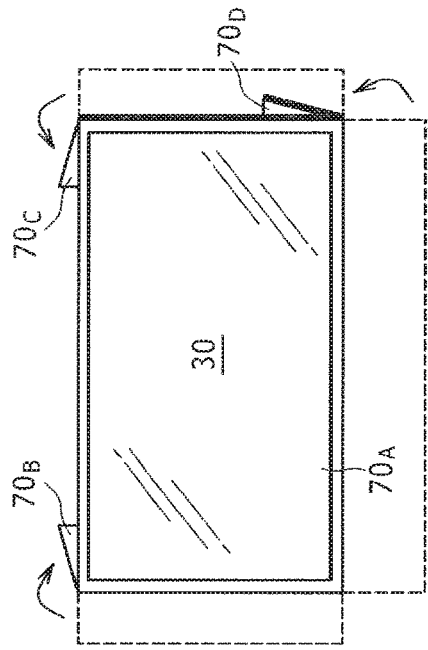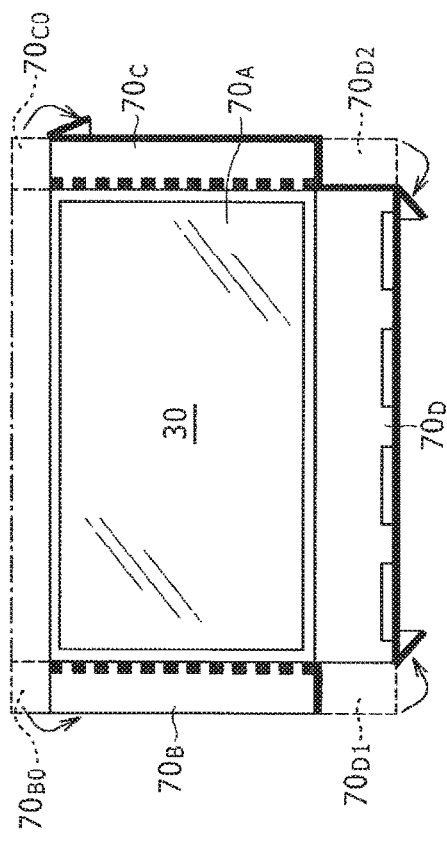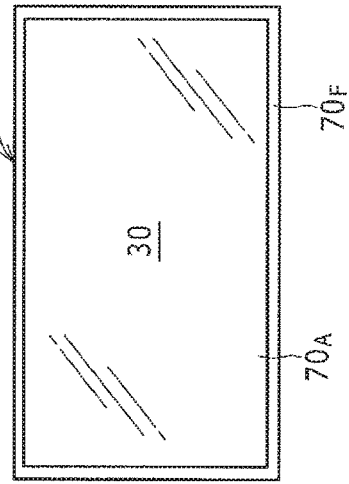
F I G. 5A  F I G. 5B  F I G. 5C  F I G. 5D BEFORE t = t₁₁ t = t₁₁ t = t₁₂ t = t₁₃

$t = t_{14}$ $t = t_{15}$ $t = t_{16}$ $t = t_{17}$

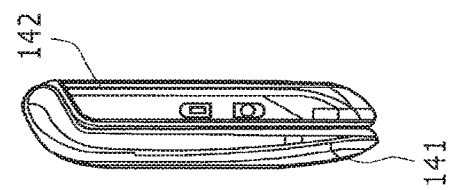
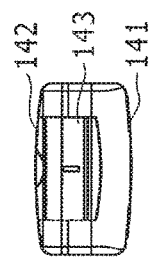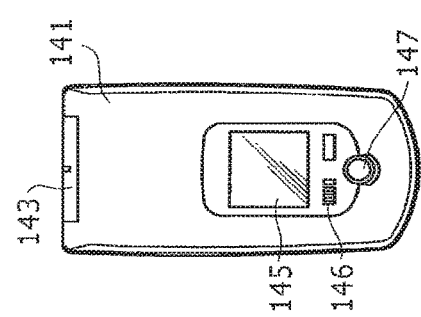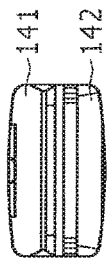
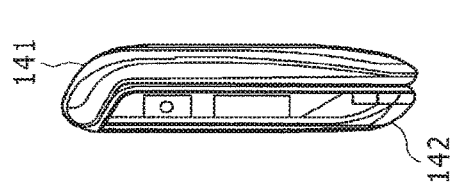
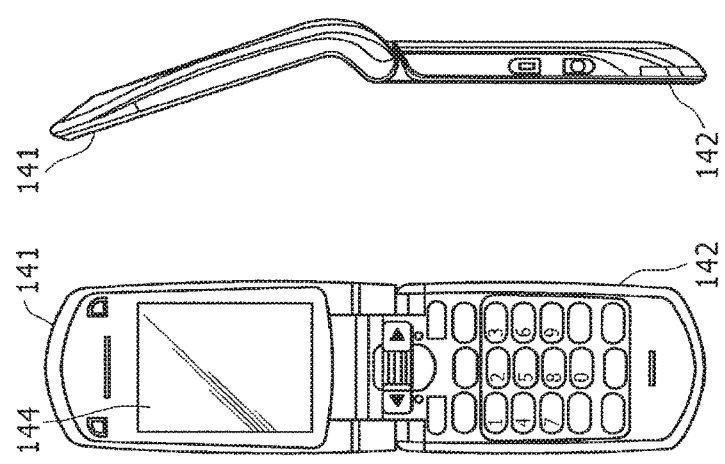

DISPLAY APPARATUS AND ELECTRONIC APPARATUS

CROSS-REFERENCE TO RELATED APPLICATIONS

This application is a Continuation of U.S. application Ser. No. 13/302,624, filed Nov. 22, 2011, which claims priority to Japanese Patent Application No. JP 2010-276940, filed in the Japan Patent Office on Dec. 13, 2010, the entire contents of which are hereby incorporated by reference in their entirety.

BACKGROUND

This technology relates to a display apparatus and an electronic apparatus, and particularly to a display apparatus wherein a plurality of pixels each including an electro-optical element are disposed in rows and columns or in a matrix and an electronic apparatus which includes a display apparatus.

In recent years, in the field of display apparatus for displaying an image, a display apparatus of a planar type, that is, of a flat panel type in which a plurality of pixels or pixel circuits are disposed in a matrix has been popularized rapidly. As one of flat panel type display apparatus, a display apparatus is available which uses, as a light emitting element of a pixel, an electro-optical element of the current driven type which emits light of the luminance which varies in response to the value of current flowing therethrough. As the current driven type electro-optical element, an organic EL element is known which makes use of a phenomenon that, if an electric field is applied to an organic thin film of an organic material, then it emits light utilizing electroluminescence (EL) of the organic material.

An organic EL displaying element which uses an organic EL element as a light emitting element of pixels has such a characteristic as described below. In particular, since the organic EL element can be driven with an application voltage of 10 V or less, the power consumption can be suppressed low. Further, since the organic EL element is a self-luminous element, visibility of a displayed image is high in comparison with a liquid crystal display apparatus. Besides, since an illuminating member such as a backlight is not required, reduction in weight and thickness can be achieved readily. Furthermore, since the speed of response of the organic EL element is approximately several μ seconds and is very high, an afterimage upon moving picture display does not appear.

The organic EL display apparatus can adopt any of a simple or passive matrix method and an active matrix method as a driving method similarly to the liquid crystal display apparatus. However, although the passive matrix type display apparatus is simple in structure, since the light emission period of the electro-optical element is reduced by increase of the number of scanning lines, or in other words, by increase of the number of pixels, there is a problem in that it is difficult to implement a large-sized and high-definition display apparatus.

Therefore, in recent years, development of an active matrix type display apparatus in which current to flow to an electro-optical element is controlled by an active element such as, for example, by an insulated gate type electric field effect transistor provided in a pixel in which the electro-optical element is provided has been and is proceeding energetically. As the insulated gate type electric field effect transistor, a TFT (Thin Film Transistor) is used popularly.

Since, in the active matrix type display apparatus, the electro-optical element continues light emission over a period of one display frame, it can be implemented readily in a large size and high definition.

A pixel circuit including a current-driven type electro-optical element which is driven by the active matrix method includes, in addition to the electro-optical element, a driving circuit for driving the electro-optical element. One of such driving circuits is disclosed, for example, in Japanese Patent Laid-Open No. 2009-103868 (hereinafter referred to as Patent Document 1). The driving circuit of Patent Document 1 is incorporated in a pixel circuit and is configured from a driving transistor 22 for driving a current-driven type electro-optical element such as, for example, an organic EL element 21, a writing transistor 23 and a retaining capacitor 24.

In Patent Document 1, an organic EL display apparatus $10_B$ in which peripheral circuit sections (40, 50 and 60) are mounted on a display panel 70 in which a pixel array section 30 configured from a great number of unit pixels $20_b$ is incorporated is disclosed (refer to paragraph 0027, FIGS. 1, 10 and so forth of Patent Document 1).

Further, in Patent Document 1, it is described to commonly use one power supplying line 32 ($32_{-1}$ to $32_{-m}$) for four subpixels $20_W$, $20_R$, $20_G$ and $20_B$ which belong to two vertically neighboring rows which configure the same unit pixel $20_b$. Furthermore, in Patent Document 1, it is described that, since the circuit scale of the writing scanning circuit 40 can be reduced by commonly using one power supplying line 32, reduction of the width of the molding of the framework of the display panel 70 can be achieved (refer to paragraph 0136 of Patent Document 1). Here, the "molding of the framework" is that region of the display panel 70 around a pixel array section 30 which does not contribute to image display.

SUMMARY

As described above, by reducing the number of circuit elements and wiring lines which configure the peripheral circuit sections for driving pixels of the pixel array section to reduce the circuit scale of the peripheral circuit sections, reduction of the width of the framework molding of the display panel can be achieved. However, since there is a limitation to reduction of the circuit scale by decrease of the number of circuit elements and wiring lines which configure the peripheral circuit sections, there is a limitation also to reduction of width of the framework molding of the display panel. Thus, if it is tried to satisfy a demand for further reduction of the width of the work molding of the display panel, then it is sometimes forced to restrict a function of a peripheral circuit to achieve reduction of the circuit scale of the peripheral circuit section.

Therefore, it is desirable to provide a display apparatus and an electronic apparatus by which further reduction of the width of the framework molding of a display panel can be achieved without restricting a function of a peripheral circuit section which drives pixels of a pixel array section.

According to the disclosed technology, there is provided a display apparatus including a foldable substrate, a pixel array section including a plurality of pixels disposed on the substrate and each including an electro-optical device, the foldable substrate being folded at a substrate end portion at least on one side thereof around the pixel array section, a peripheral circuit section disposed on the substrate end portion and adapted to drive the pixels of the pixel array section, and a pad section provided on the substrate end portion on which the peripheral circuit section is provided and adapted to electrically connect the peripheral circuit section to the outside of the substrate.

In the display apparatus having the configuration described above, since the substrate is folded at a substrate end portion at least on one side thereof around the pixel array section, the region portion around the pixel array section which does not contribute to image display, that is, the framework molding, can be reduced in size by an amount corresponding to the region of the folded substrate end portion. Thereupon, the peripheral circuit section is positioned on the substrate on which the pixel array section is provided through the folding portion. Accordingly, even if contact portions such as terminals are not interposed between the peripheral circuit section and the pixel array section, the peripheral circuit section and the pixel array section can be electrically connected to each other.

Further, the size of the substrate end portion is not limited if it remains within the range of the size of the substrate main body on which the pixel array section is mounted. Accordingly, the scale of the peripheral circuit section disposed on the substrate end portion and hence a function of the peripheral circuit section are not limited. Besides, since the pad section for electrically connecting the peripheral circuit section and the outside of the board to each other is provided on the substrate end portion on which the peripheral circuit section is provided, the distance between the folding portion of the substrate end portion and the peripheral circuit section is small. Thus, even if wiring lines cannot be laid between them, electric connection between the peripheral circuit section and the outside of the substrate can be carried out with certainty.

In summary, with the display apparatus, since a foldable substrate is used and a peripheral circuit section is disposed on a substrate end portion of the board folded at least on one side around the periphery of a pixel array section, further reduction in width of the framework molding of the display panel can be achieved without limiting any function of the peripheral circuit section. Besides, even though the distance between the folding portion of the substrate end portion and the peripheral circuit section is so small that wiring lines cannot be laid between them, electric connection between the peripheral circuit section and the outside of the substrate can be established with certainty.

BRIEF DESCRIPTION OF THE DRAWINGS

FIG. 1 is a top plan view schematically showing a structure of a display panel of a display apparatus according to an embodiment of the present technology;

FIGS. 2A and 2B are sectional views showing the display panel of FIG. 1 before and after folding thereof, respectively;

FIGS. 4A and 4B are schematic views of the display panel of FIG. 1 before and after folding of a substrate end portion;

FIGS. 5A to 5D are schematic views illustrating an example of a procedure of folding of substrate end portions;

FIGS. 24A and 24B are a front elevational view and a side elevational view, respectively, showing a portable telephone set in an unfolded state, and FIGS. 24C, 24D, 24E, 24F and 24G are a front elevational view, a left side elevational view, a right side elevational view, a top plan view and a bottom plan view, respectively, of the portable telephone set.

DETAILED DESCRIPTION OF THE PREFERRED EMBODIMENT

Figure 3:
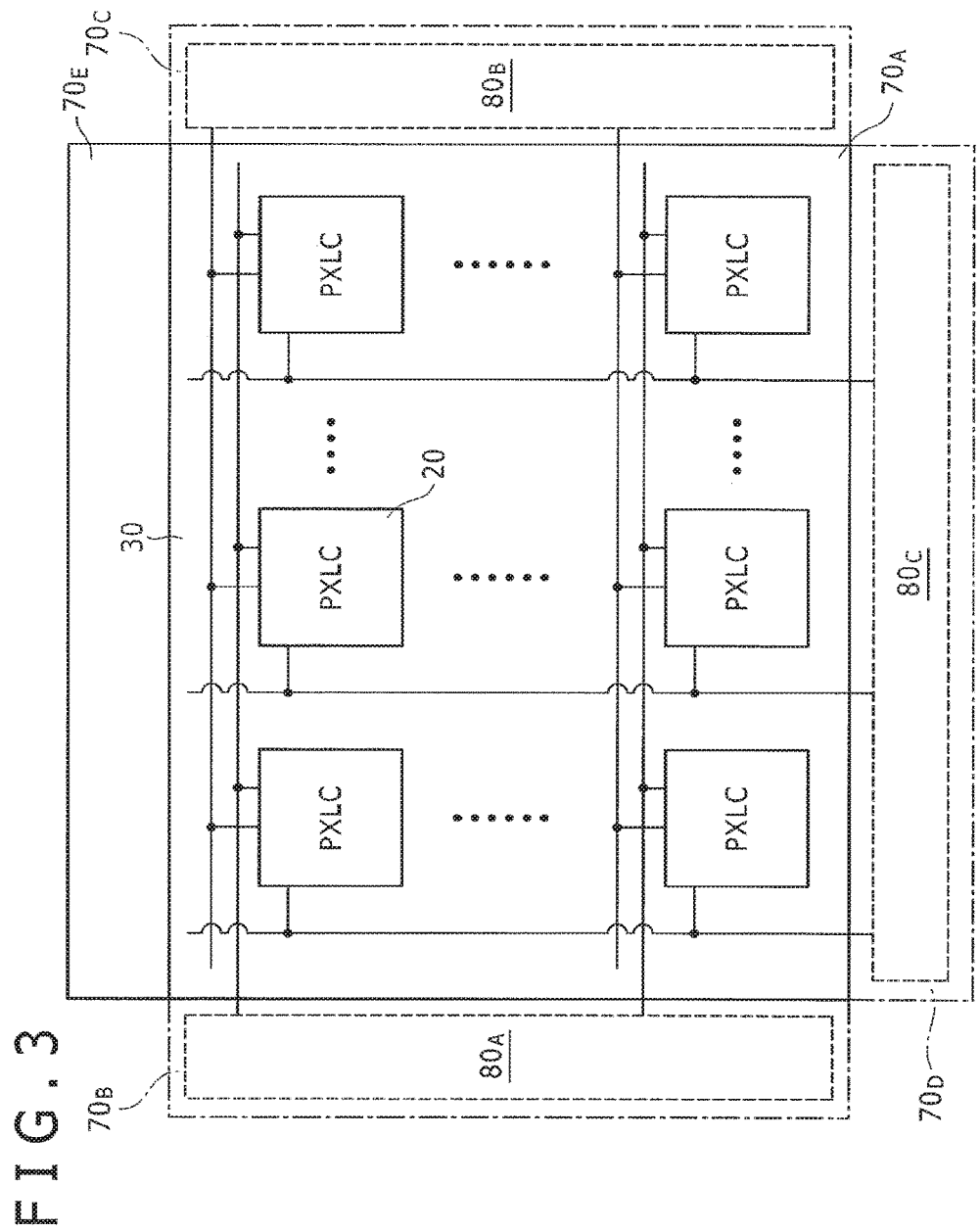
FIG. 3 is a front elevational view schematically showing a different structure of the display panel of FIG. 1.

In the following, a preferred embodiment of the disclosed technology is described in detail with reference to the accompanying drawings. It is to be noted that the description is given in the following order.

1. Embodiment
2. Organic EL Display Apparatus to which the Disclosed Technology Is Applied
   2-1. System Configuration
   2-2. Basic Circuit Action
   2-3. Example of the Configuration of the Driving Circuit Section
3. Modifications
4. Electronic Apparatus

1. Embodiment

FIG. 1 shows a general structure of a display panel of a display apparatus according to an embodiment of the disclosed technology. Meanwhile, FIGS. 2A and 2B show cross sections of the display panel before and after folding thereof, respectively.

Referring to FIGS. 1, 2A and 2B, the display apparatus 10 according to the embodiment is defined most in that a foldable or bendable substrate is used as a substrate which configures a display panel 70, more particularly as a substrate on which pixel circuits are to be formed. For the foldable substrate, a known substrate such as a metal substrate which is a thin plate of a metal, a plastic substrate or the like can be used.

Preferably, the metal substrate is formed, for example, from a stainless steel substrate from a point of view of the corrosion resistance. However, from a point of view of the insulating property, preferably a plastic substrate is used rather than a metal substrate. A thin plate of a stainless steel substrate, a plastic substrate or the like can be folded or bent readily using a known bending jig.

The display panel 70 includes a substrate main body section $70_A$, and four substrate end portions $70_B$ to $70_E$ folded to the rear face side, for example, along the four sides of a periphery of the substrate main body section $70_A$. In FIG. 1, of the four substrate end portions $70_B$ to $70_E$, the substrate end portions $70_B$ and $70_C$ on the opposite left and right sides of the substrate main body section $70_A$ and the substrate end portion $70_B$ on the lower side of the substrate main body section $70_A$ are schematically shown by alternate long and short dash lines.

A plurality of pixels or pixel circuits 20 each including an electro-optical element such as, for example, an electro-optical element of the self luminous type are arrayed two-dimensionally in rows and columns over a substantial overall area of the substrate main body section $70_A$ of the display panel 70 to configure a pixel array section 30. Here, as the electro-optical element of the self luminous type, an organic EL element, an inorganic EL element, an LED element, a semiconductor laser element and so forth are widely known. The electro-optical elements of the self luminous type are light emitting elements of the current driven type whose emitted light luminance varies in response to the value of current flowing therethrough.

Meanwhile, on the substrate end portions $70_B$ and $70_C$ on the opposite left and right sides and the substrate end portion $70_B$ on the lower side of the substrate main body section $70_A$, peripheral circuit sections $80_A$ to $80_C$ for driving the pixels 20 of the pixel array section 30 are provided. The peripheral circuit sections $80_A$ to $80_C$ are electrically connected to the pixel array section 30 through wiring lines of a wiring line section 81 as seen in FIGS. 2A and 2B. A particular example of the peripheral circuit sections $80_A$ to $80_C$ is hereinafter described.

Upon fabrication of the display panel 70, the pixels 20 of the pixel array section 30 are formed and circuit elements of the peripheral circuit sections $80_A$ to $80_C$ are formed on the bendable or foldable substrate ($70_A$ to $70_E$) in the form of a flat plate as shown in FIG. 2A. Further, wiring lines of the wiring line section 81 for electrically connecting the pixel array section 30 and the peripheral circuit sections $80_A$ to $80_C$ to each other are formed or wired.

For the display panel 70 in the form of a flat plate on which the pixel array section 30, peripheral circuit sections $80_A$ to $80_C$ and wiring line section 81 are formed in this manner, a bending or folding work is carried out, for example, from a start point at which a folding jig 82 is disposed on the rear face of the wiring line section 81 as seen in FIG. 2A. By this folding work, the substrate end portions $70_B$ and $70_C$ ($70_D$) on which the peripheral circuit sections $80_A$ and $80_B$ ($80_C$) are mounted are folded and positioned on the rear side of the substrate main body section $70_A$, that is, on the opposite side to the display face.

Accordingly, as a molding of a framework on a periphery of the pixel array section 30 of the display panel 70, only part of the wiring line section 81 exists, and therefore, the framework molding of the display panel 70 can be formed narrow or with a small width. In other words, the area of a surplus region which does not contribute to image display around the pixel array section 30 can be suppressed to a minimum necessary degree.

Besides, the pixel array section 30 and the peripheral circuit sections $80_A$ to $80_C$ are electrically connected to the wiring lines of the wiring line section 81 formed on one substrate although the substrate is folded between them. Consequently, there is no necessity to provide pad portions such as terminals which are provided in a case wherein a flexible cable or the like is used to connect an external substrate, for example, to the substrate main body section $70_A$. Accordingly, since there is no necessity to assure a region for providing pad portions, further reduction in width of the framework molding of the display panel 70 can be anticipated.

Further, the substrate end portions $70_B$ and $70_C$ ($70_D$) are not restricted in size if the size remains within a range of the size of the substrate main body section $70_A$ on which the pixel array section 30 is provided. Accordingly, the circuit scale of the peripheral circuit sections $80_A$ and $80_B$ ($80_C$) disposed on the substrate end portions $70_B$ and $70_C$ ($70_D$) and hence the function of the peripheral circuit sections $80_A$ and $80_B$ ($80_C$) are not restricted.

In the present embodiment, the display panel 70 is folded on the four sides thereof on the periphery of the pixel array section 30, and the peripheral circuit sections $80_A$, $80_B$ and $80_C$ are mounted on the three substrate end portions $70_B$, $70_C$ and $70_D$ from the four sides. However, the panel structure of the display panel 70 is not limited to this. For example, on three sides of the periphery of the pixel array section 30 on which the peripheral circuit sections $80_A$, $80_B$ and $80_C$ are mounted may be bent or folded as seen in FIG. 3. In this instance, since the substrate end portion $70_E$ which remains not bent or folded forms a margin which occupies most part of the framework, it is considered preferable to bend or fold the display panel 70 on the four sides. Further, even if four or three sides are not folded but at least one side of the periphery of the pixel array section 30 is folded, then the effect of reduction of the width of the framework molding in comparison with that in an alternative case wherein none of the four sides is folded.

As described above, as a substrate which configures the display panel 70, a foldable substrate is used. Then, by disposing the peripheral circuit sections $80_A$, $80_B$ and $80_C$ on the substrate end portions $70_B$, $70_C$ and $70_E$ folded on at least one side of the periphery of the pixel array section 30, various circuits having various functions can be mounted as the peripheral circuit sections $80_A$, $80_B$ and $80_C$ without being restricted by the framework molding size. Accordingly, further reduction of the width of the framework molding of the display panel 70 can be achieved without limiting the functions of the peripheral circuit sections $80_A$, $80_B$ and $80_C$. Particularly if the pixel array section 30 is folded on the four sides of the periphery thereof, a display apparatus which substantially eliminates the framework mounting portion and uses the overall area of the display face of the display panel 70 as a display area can be implemented.

FIGS. 4A and 4B show the display panel 70 before and after the substrate end portions $70_B$, $70_C$ and $70_D$ are folded, respectively. In the example of FIGS. 4A and 4B, from among the four sides of the periphery of the pixel array section 30, only three sides of the periphery of the pixel array section 30 on which the peripheral circuit sections $80_A$, $80_B$ and $80_C$ are mounted are folded while the remaining one side, which is shown on the upper side in FIGS. 4A and 4B, is cut away.

In FIGS. 4A and 4B, the pixel array section 30 is a valid pixel section which contributes to display of an image, that is, a display area section. The substrate end portions $70_B$ and $70_C$ on the opposite left and right sides of the pixel array section 30, that is, on the left and right sides of the substrate main body section $70_A$, and the substrate end portion $70_D$ on the lower side are folded while the substrate end portion $70_D$ on the upper side is cut off. Details are described below.

First, in order to cut away the substrate end portion $70_E$ on the upper side, a cutting portion $83_A$ is formed between the upper end of the substrate main body section $70_A$ and the substrate end portion $70_E$ such that it extends in a horizontal direction between the opposite ends of the substrate main body section $70_A$. Then, grooves $83_B$ and $83_C$ are formed between the opposite ends of the cutting portion $83_A$ and the upper end of the substrate end portion $70_E$. Consequently, the substrate end portion $70_E$ on the upper side can be cut away from the substrate main body section $70_A$.

Then, in order to fold the substrate end portions $70_B$ and $70_C$ on the opposite left and right sides, grooves $83_D$ and $83_E$ are formed on the substrate end portions $70_B$ and $70_C$ such that they extend along the lower end of the substrate main body section $70_A$ from the opposite left and right sides. Then, before the substrate end portions $70_B$ and $70_C$ are bent, upper end portions $70_{B0}$ and $70_{C0}$ of them are bent along thick broken lines. Thereafter, the substrate end portions $70_B$ and $70_C$ are bent along the thick broken lines, and the substrate end portions $70_B$ and $70_C$ are bent along the thick broken lines on the boundaries between the substrate end portions $70_B$ and $70_C$ and the substrate main body section $70_A$.

Then, for example, at an upper end of the upper end portions $70_{B0}$ and $70_{C0}$ of the substrate end portions $70_B$ and $70_C$, the peripheral circuit sections $80_A$ and $80_B$ and the outside of the substrate are electrically connected to each other. In particular, pad portions $84_A$ and $84_B$ for fetching a power supply voltage for peripheral circuit sections $80_A$ and $80_B$ and various signals from the outside of the substrate therethrough are provided. The pad portions $84_A$ and $84_B$ are provided on the substrate end portions $70_B$ and $70_C$ on which the peripheral circuit sections $80_A$ and $80_B$ are provided, respectively, more particularly at locations, that is, at the upper end portions $70_{B0}$ and $70_{C0}$, in the substrate end portions $70_B$ and $70_C$ farther than the bent portions. The pad portions $84_A$ and $84_B$ and the peripheral circuit sections $80_A$ and $80_B$ are electrically connected to each other through wiring lines on the bent portions in the substrate end portions $70_B$ and $70_C$.

Thereafter, in order to bend the substrate end portion $70_D$, the opposite end portions $70_{D1}$ and $70_{D2}$ of the substrate end portion $70_D$ are first bent along thick broken lines on extension lines of bending lines of the substrate end portions $70_B$ and $70_C$ on the boundaries of the grooves $83_D$ and $83_E$. Then, the substrate end portion $70_D$ is bent along a thick broken line on the boundary between the substrate end portion $70_D$ and the substrate main body section $70_A$, that is, along a thick broken line interconnecting the grooves $83_D$ and $83_E$.

Here, it is assumed that, as an example, the peripheral circuit section $80_C$ mounted on the substrate end portion $70_D$ is a signal outputting circuit which outputs a video signal supplied from a signal supply source not shown provided externally of the substrate as hereinafter described to the pixels of the pixel array section 30. In this instance, the pad portion group $84_C$ for fetching a video signal from the outside of the substrate is provided for each pixel column of the pixel array section 30 at a lower end of the substrate end portion $70_D$. The pad portion group $84_C$ is provided substantially corresponding to the pixel columns of the pixel array section 30 over the width of the pixel array section 30 in the horizontal direction.

A pair of pad portions $84_D$ and $84_E$ for electrically connecting the peripheral circuit section $80_C$ and the outside of the substrate to each other, that is, for fetching gate controlling signals for controlling, for example, transistors which configure the signal outputting circuit described above from the outside of the substrate, are provided, for example, at a lower end of the opposite end portions $70_{D1}$ and $70_{D2}$ of the substrate end portion $70_D$, respectively. In particular, the pad portions $84_D$ and $84_E$ are provided on the substrate end portion $70_D$ on which the signal outputting circuit formed from the peripheral circuit section $80_C$ is provided, more particularly at locations, that is, at the opposite end portions $70_{D1}$ and $70_{D2}$, in the substrate end portion $70_D$ farther than the bent portions. Then, the pad portions $84_D$ and $84_E$ and the peripheral circuit section $80_C$ are electrically connected to each other by wiring lines on the bent portions in the substrate end portion $70_D$.

As described hereinabove, by cutting away the substrate end portion $70_E$ on the upper side from the substrate main body section $70_A$ and then bending the substrate end portions $70_B$ and $70_C$ on the opposite left and right sides and the substrate end portion $70_D$ on the lower side, the display panel 70 substantially of a size of the substrate main body section $70_A$ can be implemented. However, since it is necessary to assure a bending margin at the bent portions of the substrate end portions $70_B$, $70_C$ and $70_D$, the final display panel 70 has some framework molding $70_F$ on the periphery of the substrate main body section $70_A$ as seen in FIG. 4B.

Further, by disposing the peripheral circuit sections $80_A$, $80_B$ and $80_C$ on the folded substrate end portions $70_B$, $70_C$ and $70_D$, circuits having various functions can be incorporated as the peripheral circuit sections $80_A$, $80_B$ and $80_C$ without being restricted by the framework molding size. Accordingly, further reduction in width of the framework molding of the display panel 70 can be achieved without limiting the functions of the peripheral circuit sections $80_A$, $80_B$ and $80_C$.

Besides, pad portions $84_A$, $84_B$, $84_D$ and $84_E$ for electrically connecting the peripheral circuit sections $80_A$, $80_B$ and $80_C$ and the outside of the substrate to each other are provided on the substrate end portions $70_B$, $70_C$ and $70_D$ on which the peripheral circuit sections $80_A$, $80_B$ and $80_C$ are provided, respectively. More particularly, the pad portions $84_A$, $84_B$, $84_D$ and $84_E$ are provided at locations on the substrate end portions $70_B$, $70_C$ and $70_B$ farther than the bend portions in the substrate end portions $70_B$, $70_C$ and $70_D$, that is, at the upper end portions $70_{B0}$ and $70_{C0}$ and the opposite end portions $70_{B1}$ and $70_{D2}$ of the substrate end portions $70_B$, $70_C$ and $70_D$. Consequently, the distance between the bent portions in the substrate end portions $70_B$, $70_C$ and $70_D$ and the peripheral circuit sections $80_A$, $80_B$ and $80_C$ is small, and even if wiring lines cannot be laid, electric connection between the peripheral circuit sections $80_A$, $80_B$ and $80_C$ and the outside of the substrate can be established with certainty.

Here, an example of a procedure of bending or folding of the substrate end portions $70_B$, $70_C$ and $70_D$ of the substrate having the structure described above is described with reference to FIGS. 5A to 5D. FIG. 5A corresponds to FIG. 4A.

In the state illustrated in FIG. 5A, the substrate end portion $70_E$ on the upper side is cut away from the substrate main body section $70_A$. Then, the upper end portions $70_{B0}$ and $70_{C0}$ of the substrate end portions $70_B$ and $70_C$ on the opposite left and right sides are folded to the rear face side of the substrate end portions $70_B$ and $70_C$ as indicated by arrow marks in FIG. 5B. Further, the opposite end portions $70_{D1}$ and $70_{D2}$ of the substrate end portion $70_D$ on the lower side is folded to the rear face side of the substrate end portion $70_D$ as indicated by arrow marks.

Then, the substrate end portions $70_B$ and $70_C$ on the opposite left and right sides are folded to the rear face side of the substrate main body section $70_A$ as indicated by arrow marks, and then the substrate end portion $70_D$ on the lower side is bent or folded to the rear face side of the substrate main body section $70_A$ as indicated by arrow marks. Consequently, the display panel 70 having some framework molding $70_F$ on the periphery of the substrate main body section $70_A$ as seen in FIG. 5D is formed. FIG. 5D corresponds to FIG. 4B.

Figure 6:
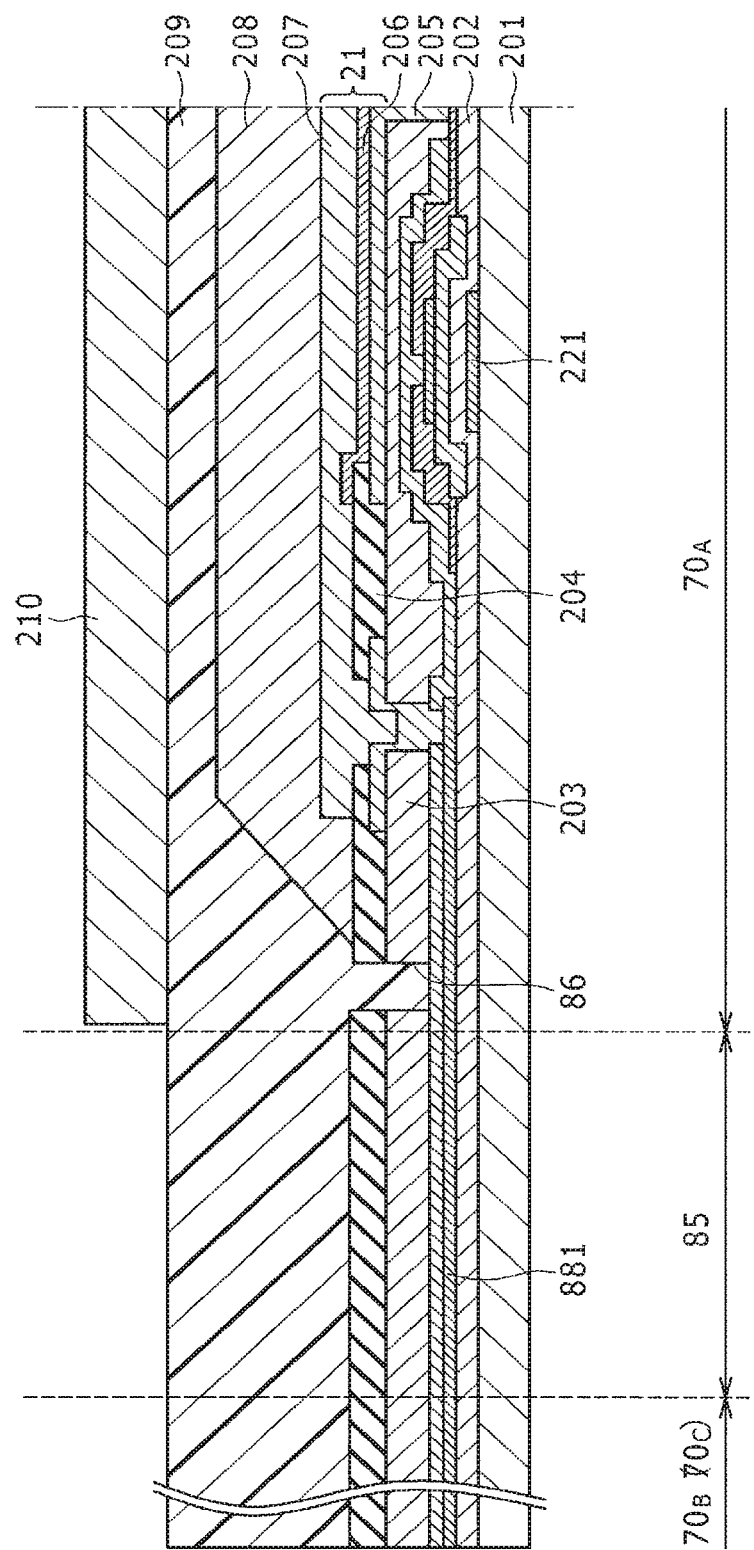
FIG. 6 is a partial sectional view showing an example of a structure of the display panel of FIG. 1.

Now, a structure of the display panel 70 is described with reference to FIG. 6. FIG. 6 shows a partial section of an example of the structure of the display panel 70.

As described hereinabove, the display panel 70 includes the substrate main body section $70_A$ on which the pixel array section 30 is formed, the substrate end portion $70_B$ ($70_C$) on which the peripheral circuit section $80_A$ ($80_B$) is formed, and a folding or bending region 85 positioned between the substrate main body section $70_A$ and the substrate end portion $70_B$ ($70_C$) as seen in FIG. 2. The wiring line section 81 for electrically connecting the peripheral circuit section $80_A$ ($80_B$) and the pixel array section 30 to each other is formed in the folding region 85. In other words, on the wiring line section 81 of the folding region 85, only simple metal wiring lines are laid out while any circuit section including a transistor or the like is not laid out.

In FIG. 6, a circuit section including thin film transistors (TFTs) 22 including a gate electrode 221 and so forth is formed on a foldable substrate 201. Further, an insulating film, that is, a gate insulating film 202, a flattening film 203 and a window insulating film 204 are laminated in this order on the substrate 201. Further, as an electro-optical element, for example, an organic EL element 21 is formed in a recessed portion of the window insulating film 204. The TFTs 22 are, for example, driving transistors for driving such organic EL elements 21.

Each organic EL element 21 includes an anode electrode 205, an organic layer 206, and a cathode electrode 207. The anode electrode 205 is made of a metal formed on the bottom of the recessed portion of the window insulating film 204. The organic layer 206 is formed on the anode electrode 205. The cathode electrode 207 is formed from a transparent conductor film or the like formed commonly to all pixels on the organic layer 206.

In the organic EL element 21, the organic layer 206 is formed from a hole transport layer/hole implantation layer, a light emitting layer, an electron transport layer and an electron implantation layer successively deposited on the anode electrode 205. Then, under current driving by the TFT 22, current flows from the TFT 22 to the organic layer 206 through the anode electrode 205, whereupon electrons and holes are recombined in the light emitting layer in the organic layer 206 to emit light.

The pixel section including the organic EL elements 21 and the TFTs 22 is protected by a protective layer 208 from above. The substrate 201 is covered over an overall area thereof with a sheet resin 209. Further, above the sheet resin 209 on the substrate main body section $70_A$ on which the pixel array section 30 is formed, an opposing substrate 209 which is a second substrate formed from a sealing film, a glass substrate or the like is disposed. In other words, the opposing substrate 210 is disposed only in a region of the substrate main body section $70_A$ so as not to extend to the folding region 85.

As apparently seen from FIG. 6, only metal wiring lines 811 are laid out in the wiring line section 81 of the folding region 85 while a circuit section including a transistor or like is not laid out. In particular, the folding region 85 is configured such that the metal wiring lines 811 are formed on the substrate 201 with the insulating film 202 interposed therebetween and the flattening film 203 and the window insulating film 204 are laminated in order on the metal wiring lines 811 and are covered with the sheet resin 209 from above.

Incidentally, the display panel 70 of the panel structure described above sometimes suffers from crazing or cracking when the display panel 70 is folded at the folding region 85. If cracking occurs, then water or the like may invade into the display panel 70 through the crack and may possibly deteriorate a circuit element of the pixel array section 30.

Figure 7:
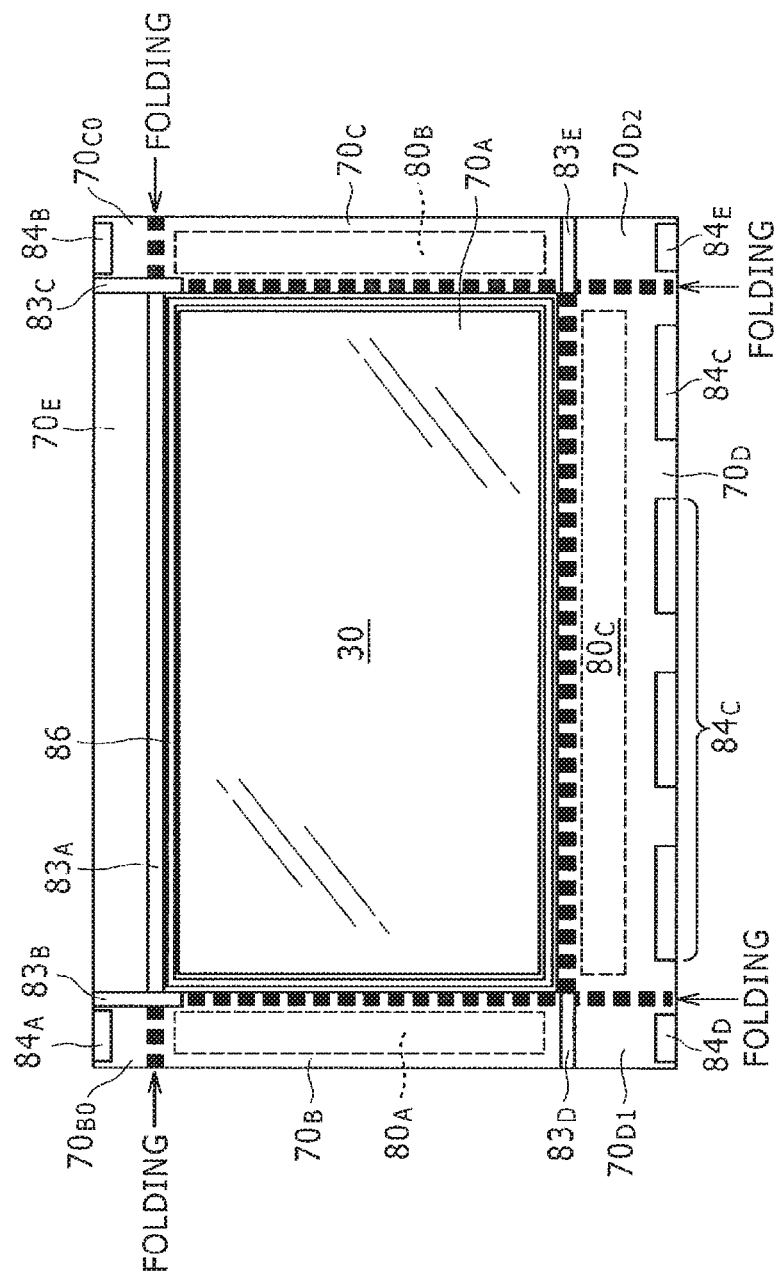
FIG. 7 is a top plan view showing a panel structure which has a water invasion preventing groove at a basic main body section of the display panel of FIG. 1.

Therefore, in order to prevent such invasion of water or the like through the crack thereby to prevent deterioration of the circuit elements, the display panel 70 in the present embodiment has a panel structure wherein a water invasion preventing groove 86 is provided on the substrate 201 on the pixel array section 30 side with respect to the folding region 85. The water invasion preventing groove 86 is formed such that it surrounds the pixel array section 30 as seen in a plan view of FIG. 7. The water invasion preventing groove 86 is formed by removing the flattening film 203 and the window insulating film 204 as apparently seen from the sectional view of FIG. 6.

By adopting the panel structure in which the water invasion preventing groove 86 is provided in this manner, even if a crack appears when the display panel 70 is folded, water or the like invading from the crack is accumulated in the water invasion preventing groove 86 and is prevented from further invading to the pixel array section 30 side by the water invasion preventing groove 86. Accordingly, deterioration of the circuit elements which may arise from water or the like invading through the crack can be prevented, and consequently, electric reliability of the display panel 70 is not damaged. In other words, while electric reliability of the display panel 70 is maintained, reduction in width of the framework molding of the display panel 70 by folding of the substrate can be anticipated.

It is to be noted that, while it is described above that the water invasion preventing groove 86 is formed on the substrate 201 on the pixel array section 30 side with respect to the folding region 85 in such a manner as to surround the pixel array section 30, the water invasion preventing groove 86 need not necessarily be formed on the display panel 70 side. In particular, in addition to a water invasion preventing groove $86_A$ on the pixel array section 30, a water invasion preventing groove 86 may be formed at least one of the substrate end portions $70_B$, $70_C$ and $70_D$ as seen in FIG. 8.

Figure 8:
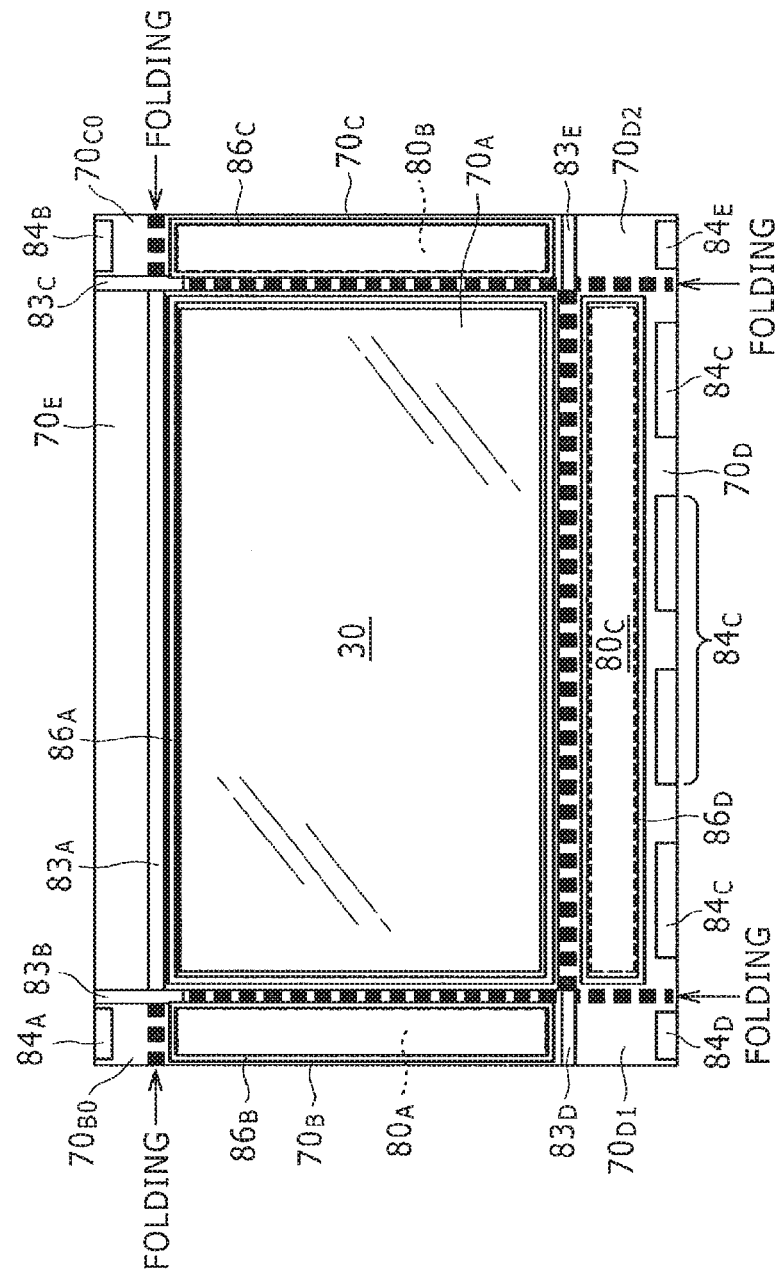
FIG. 8 is a top plan view showing another panel structure which has a water invasion preventing groove at a basic main body portion and a substrate end portion of the display panel of FIG. 1.

In particular, referring to FIG. 8, water invasion preventing groove $86_B$, $86_C$ and $86_D$ may be formed on the substrate end portions $70_B$, $70_C$ and $70_D$ on the peripheral circuit sections $80_A$, $80_B$ and $80_C$ side with respect to the folding region 85 in such a manner as to surround the peripheral circuit sections $80_A$, $80_B$ and $80_C$, respectively. Although it is shown in FIG. 8 that the water invasion preventing groove 86 ($86_B$, $86_C$ and $86_D$) is formed on all of the substrate end portions $70_B$, $70_C$ and $70_D$, it may otherwise be formed on only one of the substrate end portions $70_B$, $70_C$ and $70_D$.

By forming the water invasion preventing groove 86 also on the substrate end portions $70_B$, $70_C$ and $70_D$ side in this manner, even if a crack appears on the substrate end portions $70_B$, $70_C$ and $70_D$ when the display panel 70 is folded, a working effect similar to that of the substrate main body section $70_A$ can be achieved. In particular, water or the like invading from the crack is accumulated in the water invasion preventing grooves $86_B$, $86_C$ and $86_D$ and is prevented from further invading toward the peripheral circuit sections $80_A$, $80_B$ and $80_C$ side by the water invasion preventing grooves $86_B$, $86_C$ and $86_C$. Accordingly, otherwise possible deterioration of the circuit elements of the peripheral circuit sections $80_A$, $80_B$ and $80_C$ arising from water or the like invading through the crack can be prevented, and therefore, electric reliability of the display panel 70 is not damaged. In other words, while electric reliability of the display panel 70 is further maintained, reduction in width of the framework molding of framework of the display panel 70 by folding of the substrate can be achieved.

2. Organic EL Display Apparatus to which the Disclosed Technology is Applied

The display apparatus in which a display panel can be configured by using a foldable or bendable substrate includes a display apparatus of a flat panel type using an electro-optical element of the self luminous type as the electro-optical element of the pixels 20. An organic EL display apparatus making use of an organic EL element as an electro-optical element is described below.

2-1. System Configuration

Figure 9:
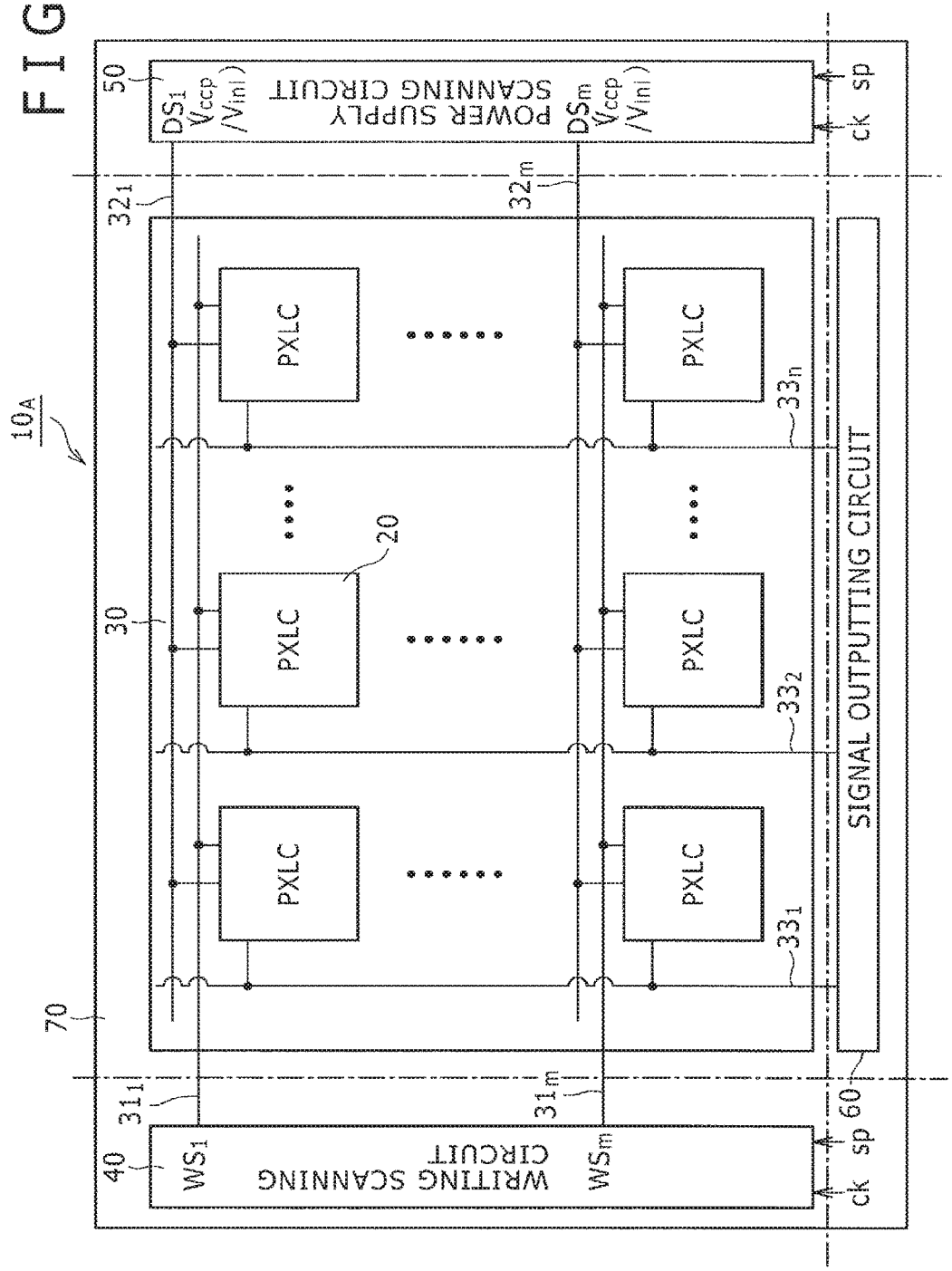
FIG. 9 is a block diagram showing a general configuration of an organic EL display apparatus to which the display apparatus according to the embodiment of the disclosed technology is applied.

FIG. 9 shows a general configuration of an active matrix type organic EL display apparatus to which the disclosed technology is applied.

Referring to FIG. 9, the organic EL display apparatus $10_A$ according to the present application includes a pixel array section 30 in which a plurality of pixels 20 each including an organic EL element are arrayed two-dimensionally in rows and columns, and peripheral circuit sections disposed around the pixel array section 30. The peripheral circuit sections include a writing scanning circuit 40, a power supply scanning circuit 50, a signal outputting circuit 60 and so forth and drive the pixels 20 of the pixel array section 30.

If the organic EL display apparatus $10_A$ is ready for color display, then one pixel is configured from a plurality of subpixels, and each of the subpixels corresponds to a pixel 20. More particularly, in a display apparatus for color display, one pixel is configured from three sub pixels including a subpixel for emitting red light (R), another subpixel for emitting green light (G) and a further subpixel for emitting blue light (B).

However, one pixel is not limited to a combination of subpixels of the three primary colors of red, green and blue but may be configured from one subpixel of a color or a plurality of subpixels of different colors in addition to subpixels of the three primary colors. More particularly, in order to improve the luminance, a subpixel for emitting white light (W) may be additionally used to configure one pixel or at least one subpixel for emitting complementary color light for enlarging the color reproduction range may be additionally used to configure one pixel.

The pixel array section 30 corresponds to the pixel array section 30 described hereinabove in connection with the embodiment of the disclosed technology and is formed on a foldable substrate (201), that is, on the substrate main body section $70_A$ of the embodiment described hereinabove. The pixel array section 30 includes scanning lines $31_1$ to $31_m$, power supply lines $32_1$ to $32_m$, and signal lines $33_1$ to $33_n$. The scanning lines $31_1$ to $31_m$ and the power supply lines $32_1$ to $32_m$ are wired for the individual pixel rows along a row direction, that is, along a direction in which the pixels are arrayed in a pixel row, for the array of the pixels 20 arrayed in m rows and n columns. The signal lines $33_1$ to $33_n$ are wired for the individual pixel columns along a column direction, that is, in a direction in which the pixels are arrayed in a pixel column.

The scanning lines $31_1$ to $31_m$, power supply lines $32_1$ to $32_m$ and signal lines $33_1$ to $33_n$ correspond to wiring lines of the wiring line section 81 in the embodiment described hereinabove. Further, the writing scanning circuit 40, power supply scanning circuit 50 and signal outputting circuit 60 correspond to the peripheral circuit sections $80_A$, $80_B$ and $80_C$ in the embodiment described hereinabove, respectively.

The scanning lines $31_1$ to $31_m$ are connected to output terminals of corresponding rows of the writing scanning circuit 40. The power supply lines $32_1$ to $32_m$ are connected to output terminals of corresponding rows of the power supply scanning circuit 50. The signal lines $33_1$ to $33_n$ are connected to output terminals of corresponding columns of the signal outputting circuit 60.

The writing scanning circuit 40 is configured from a shift register which shifts or transfers a start pulse sp in response to a clock pulse ck or from a like circuit. A detailed configuration of the writing scanning circuit 40 is hereinafter described. Upon writing of a video signal into the pixels 20 of the pixel array section 30, the writing scanning circuit 40 successively supplies writing scanning signals WS ($WS_1$ to $WS_n$) to the scanning lines 31 ($31_1$ to $31_m$) to successively scan the pixels 20 of the pixel array section 30 in a unit of a row (line-sequential scanning).

The power supply scanning circuit 50 is configured from a shift register which shifts a start pulse sp in response to the clock pulse ck or a like circuit. The power supply scanning circuit 50 supplies power supply potentials DS ($DS_1$ to $DS_m$), which can change over between a first power supply potential $V_{ccp}$ and a second power supply potential $V_{ini}$ which is lower than the first power supply potential $V_{ccp}$, to the power supply lines 32 ($32_1$ to $32_m$) in synchronism with line-sequential scanning by the writing scanning circuit 40. As hereinafter described, light emission/no-light emission control of the pixels 20 is carried out by changeover of the power supply potential DS between the first power supply potential $V_{ccp}$ and the second power supply potential $V_{ini}$ as hereinafter described.

The signal outputting circuit 60 selectively outputs a signal voltage $V_{sig}$ of a video signal corresponding to luminance information supplied thereto from a signal supplying source not shown and a reference potential $V_{ofs}$. Here, the reference potential $V_{ofs}$ is a potential which makes a reference to the signal voltage $V_{sig}$ of the video signal such as, for example, a potential corresponding to the black level of the video signal, and is used upon a threshold value correction process hereinafter described.

The signal voltage $V_{sig}$/reference potential $V_{ofs}$ outputted from the signal outputting circuit 60 is written into the pixels 20 of the pixel array section 30 through the signal lines 33 ($33_1$ to $33_n$) in a unit of a pixel row selected by scanning by the writing scanning circuit 40. In particular, the signal outputting circuit 60 adopts a driving form for line-sequential scanning of writing the signal voltage $V_{sig}$ in a unit of a row or line.

As described hereinabove, the display panel 70 on which the pixel array section 30, writing scanning circuit 40, power supply scanning circuit 50 and signal outputting circuit 60 are mounted is formed from a foldable substrate and is folded at portions thereof indicated by alternate long and short dash lines on the periphery of the pixel array section 30. Consequently, reduction of the width of the frame molding of the display panel 70 can be achieved without restricting the functions of the writing scanning circuit 40, power supply scanning circuit 50 and signal outputting circuit 60. The functions of the writing scanning circuit 40, power supply scanning circuit 50 and signal outputting circuit 60 are hereinafter described.

Pixel Circuit

Figure 10:
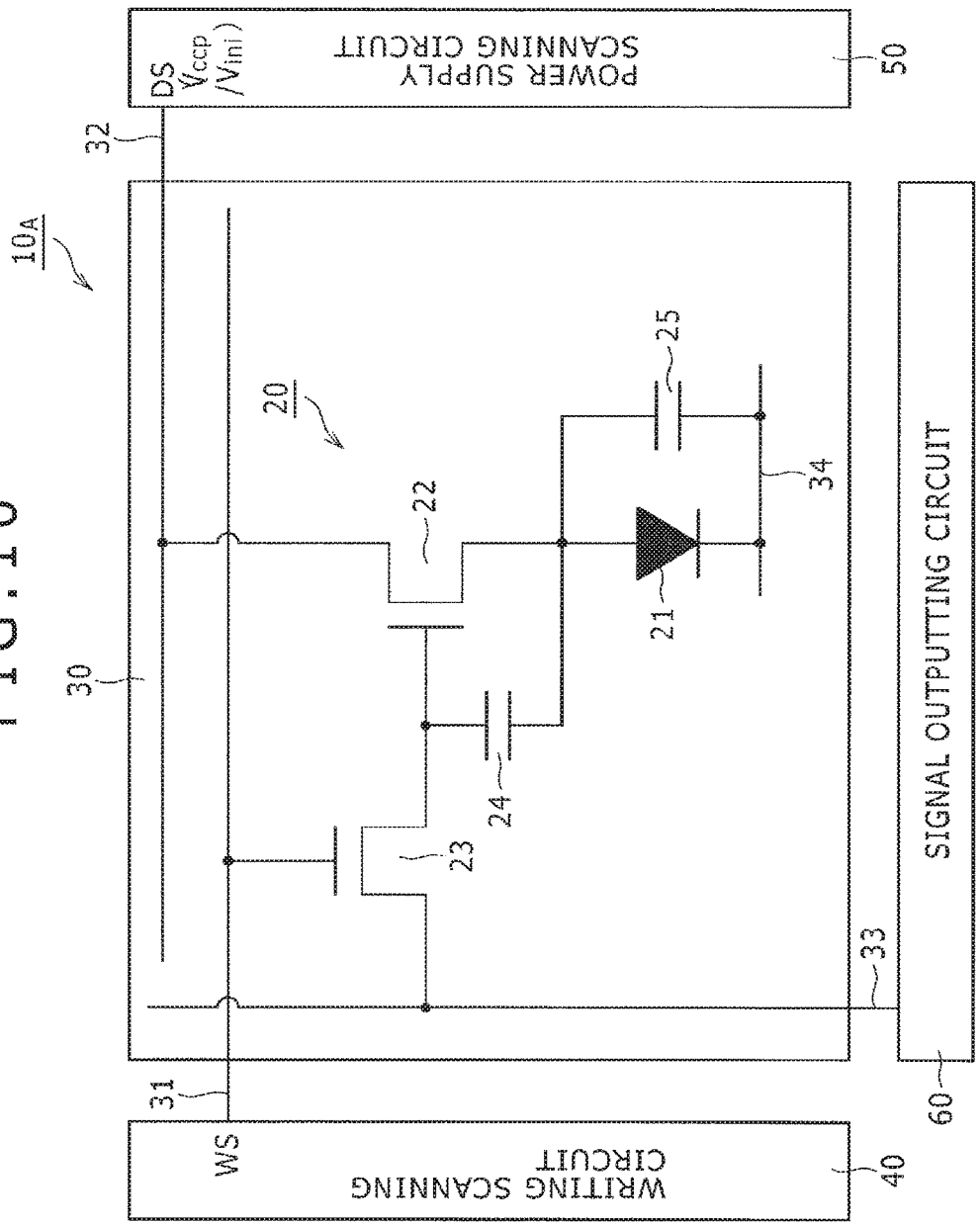
FIG. 10 is a circuit diagram showing an example of a circuit configuration of each pixel of the organic EL display apparatus of FIG. 9.

FIG. 10 shows an example of a particular circuit configuration of each pixel or pixel circuit 20. A light emitting section of the pixel 20 is formed from an organic EL element 21 which is an electro-optical element of the current driven type which emits light whose luminance varies in response to the value of current flowing therethrough.

Referring to FIG. 10, the pixel 20 is configured from an organic EL element 21, and a driving circuit for supplying current to the organic EL element 21 to drive the organic EL element 21. The organic EL element 21 is connected at the cathode electrode thereof to a common power supply line 34 wired commonly to all pixels 20.

The driving circuit for driving the organic EL element 21 includes a driving transistor 22, a writing transistor 23, a retaining capacitor 24, and an auxiliary capacitor 25. A TFT of the N channel type can be used for the driving transistor 22 and the writing transistor 23. However, the combination of the conduction types of the driving transistor 22 and the writing transistor 23 described here is a mere example, and the combination of conduction types of the driving transistor 22 and the writing transistor 23 is not limited to this specific one.

The driving transistor 22 is connected at one electrode thereof, that is, at one of the source and drain electrodes thereof, to the anode electrode of the organic EL element 21, and at the other electrode thereof, that is, at the drain or source electrode thereof, to a power supply line 32 ($32_1$ to $32_m$).

The writing transistor 23 is connected at one electrode thereof, that is, at one of the source and drain electrodes thereof, to a signal line 33 ($33_1$ to $33_n$) and at the other electrode thereof, that is, at the drain or source electrode thereof, to the gate electrode of the driving transistor 22. Further, the writing transistor 23 is connected at the gate electrode thereof to a scanning line 31 ($31_1$ to $31_m$).

The one of the electrodes of the driving transistor 22 and the writing transistor 23 is a metal wiring line electrically connected to the source/drain region, and the other electrode is a metal wiring line electrically connected to the drain/source region. Further, the one electrode may serve as the source electrode or the drain electrode and the other electrode may serve as the drain electrode and the source electrode depending upon the potential relationship between the one electrode and the other electrode.

The retaining capacitor 24 is connected at one electrode thereof to the gate electrode of the driving transistor 22 and at the other electrode thereof to the other electrode of the driving transistor 22 and the anode electrode of the organic EL element 21.

The auxiliary capacitor 25 is connected at one electrode thereof to the anode electrode of the organic EL element 21 and at the other electrode thereof to the common power supply line 34. The auxiliary capacitor 25 is provided as occasion demands in order to compensate for shortage of the capacitance of the organic EL element 21 and raise the write gain of a video signal into the retaining capacitor 24. In other words, the auxiliary capacitor 25 is not an essentially required component and can be omitted in the case where the equivalent capacitance of the organic EL element 21 is sufficiently high.

While the other electrode of the auxiliary capacitor 25 here is connected to the common power supply line 34, the connection destination of the other electrode of the auxiliary capacitor 25 is not limited to the common power supply line 34 but may be a node of a fixed potential. By connecting the other electrode of the auxiliary capacitor 25 to the node of a fixed potential, it is possible to compensate for shortage of the capacitance of the organic EL element 21 and achieve the intended aim of raising the write gain of a video signal into the retaining capacitor 24.

In the pixel 20 of the configuration described above, the writing transistor 23 is placed into a conducting state in response to a High-active writing scanning signal WS applied to the gate electrode thereof from the writing scanning circuit 40 through the scanning line 31. Consequently, the writing transistor 23 samples the signal voltage $V_{sig}$ or the reference potential $V_{ofs}$ of the video signal corresponding to luminance information supplied thereto from the signal outputting circuit 60 through the signal line 33 and writes the sampled voltage into a pixel 20. The signal voltage $V_{sig}$ or reference potential $V_{ofs}$ thus written in is applied to the gate electrode of the driving transistor 22 and retained into the retaining capacitor 24.

When the power supply potential DS of the power supply line 32 ($32_1$ to $32_m$) is the first power supply potential $V_{ccp}$, the driving transistor 22 operates in a saturation region while the one electrode of the driving transistor 22 serves as the drain electrode and the other electrode of the driving transistor 22 serves as the source electrode. Consequently, the driving transistor 22 receives supply of current from the power supply line 32 and drives the organic EL element 21 by current driving to emit light. More particularly, the driving transistor 22 operates in a saturation region such that it supplies driving current of a current value corresponding to the voltage value of the signal voltage $V_{sig}$ retained in the retaining capacitor 24 to the organic EL element 21 such that the organic EL element 21 is driven by current driving to emit light.

On the other hand, if the power supply potential DS changes over from the first power supply potential $V_{ccp}$ to the second power supply potential $V_{ini}$, then the driving transistor 22 operates as a switching transistor while the one electrode serves as the source electrode and the other electrode serves as the drain electrode. Then, the driving transistor 22 is placed into a non-conducting state to stop the supply of driving current to the organic EL element 21 thereto to place the organic EL element 21 into a no-light emitting state. In other words, the driving transistor 22 has also a function as a transistor for controlling light emission/no-light emission of the organic EL element 21.

By this switching operation of the driving transistor 22, it is possible to provide a period within which the organic EL element 21 is in a no-light emitting state, that is, in a no-light emitting period and control the rate between the light emitting period and the no-light emitting period of the organic EL element 21, that is, the duty of the organic EL element 21. By this duty control, remaining image blurring caused by emission of light by a pixel over one display frame period can be reduced, and consequently, the picture quality of a moving picture can be further improved.

Of the first and second power supply potentials $V_{ccp}$ and $V_{ini}$ supplied selectively from the power supply scanning circuit 50 through the power supply line 32, the first power supply potential $V_{ccp}$ is a power supply potential for supplying driving current for driving the organic EL element 21 to emit light to the driving transistor 22. Meanwhile, the second power supply potential $V_{ini}$ is another power supply potential for applying a reverse bias to the organic EL element 21. This second power supply potential $V_{ini}$ is set to a potential lower than the reference potential $V_{ofs}$, for example, where a threshold voltage of the driving transistor 22 is represented by $V_{th}$, to a potential lower than $V_{ofs}-V_{th}$, preferably to a potential sufficiently lower than $V_{ofs}-V_{th}$.

2-2. Basic Circuit Action

Now, basic circuit action of the display apparatus 10 having the configuration described above is described with reference to FIGS. 11 to 13D. It is to be noted that, in FIGS. 12A to 13D, the writing transistor 23 is indicated by a symbol of a switch for simplified illustration.

Figure 11:
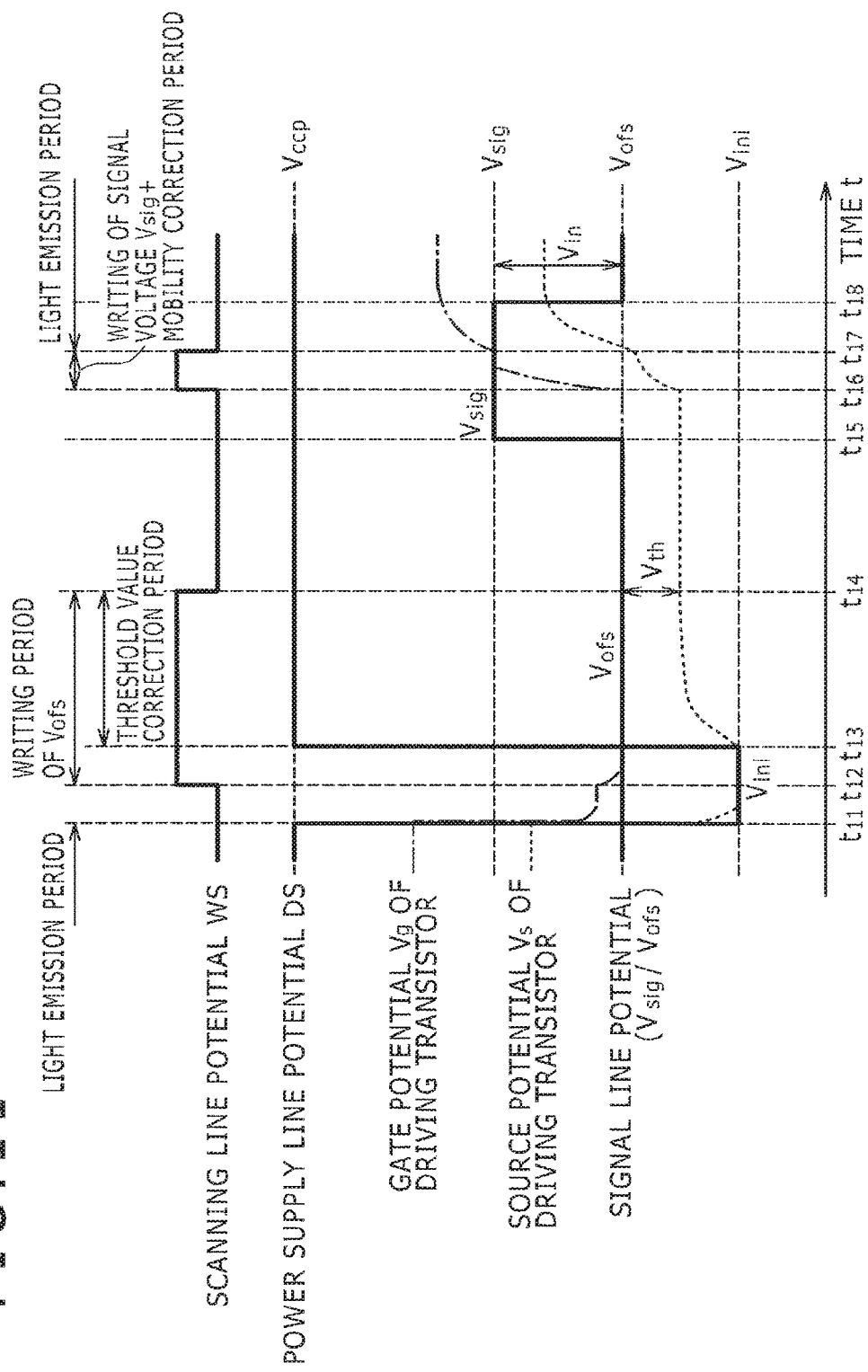
FIG. 11 is a timing waveform diagram illustrating basic circuit operation of the organic EL display apparatus of FIG. 9.

In FIG. 11, variations of the potential DS, that is, the write scanning signal WS, of a scanning line 31, the potential DS, that is, the power supply potential, of a power supply line 32, the potential ($V_{sig}/V_{ofs}$) of a signal line 33, and the gate potential $V_g$ and the source potential $V_s$ of the driving transistor 22 are illustrated. Further, the waveform of the gate potential $V_g$ of the driving transistor 22 is indicated by an alternate long and short dash line while the waveform of the source potential $V_s$ is indicated by a broken line so that they can be distinguished from each other.

Light Emitting Period of a Pre-Display Frame

In FIG. 11, a period before time $t_{11}$ is a light emitting period of the organic EL element 21 in a preceding display frame. Within the light emitting period of the pre-display frame, the power supply potential DS of the power supply line 32 exhibits a first power supply potential (hereinafter referred to as "high potential") $V_{ccp}$ while the writing transistor 23 is in a non-conducting state.

Figure 12A:
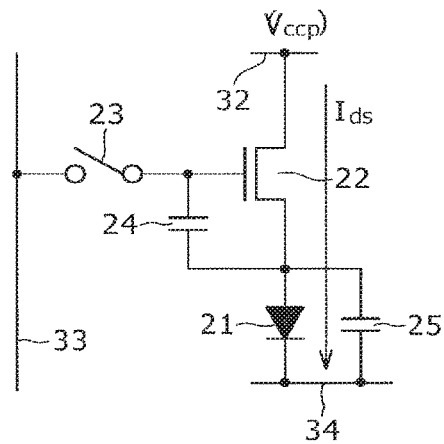
FIGS. 12A to 12D and 13A to 13D are circuit diagrams illustrating basic circuit operation of the organic EL display apparatus of FIG. 9.

The driving transistor 22 is designed such that, at this time, it operates in a saturation region. Consequently, driving current or drain-source current $I_{ds}$ corresponding to the gate-source voltage $V_{gs}$ of the driving transistor 22 is supplied from the power supply line 32 to the organic EL element 21 through the driving transistor 22 as seen in FIG. 12A. Consequently, the organic EL element 21 emits light with a luminance corresponding to the current value of the driving current $I_{ds}$.

Threshold Value Correction Preparation Period

Figure 12B:
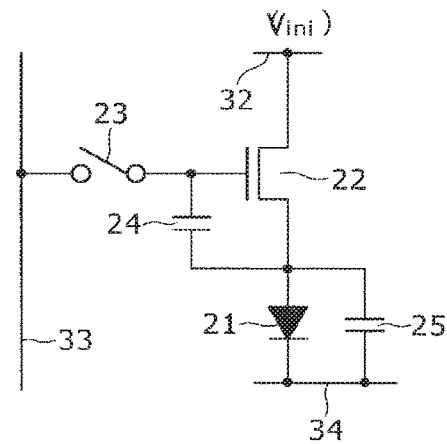

When time $t_{11}$ comes, a new display frame (current display frame) of line-sequential scanning is entered. Then, the power supply potential DS of the power supply line 32 changes over from the high potential $V_{ccp}$ to the second power supply potential $V_{ini}$ (hereinafter referred to as "low potential"), which is sufficiently lower than $V_{ofs}-V_{th}$ from the reference potential $V_{ofs}$ of the signal line 33 as seen in FIG. 12B.

Here, the threshold voltage of the organic EL element 21 is represented by $V_{thel}$ and the potential, that is, the cathode potential, of the common power supply line 34 is represented by $V_{cath}$. At this time, if the low potential $V_{ini}$ satisfies $V_{ini}<V_{thel}+V_{cath}$ then since the source potential $V_s$ of the driving transistor 22 becomes substantially equal to the low potential $V_{ini}$, the organic EL element 21 is placed into a reversely biased state and turned off.

Figure 12C:
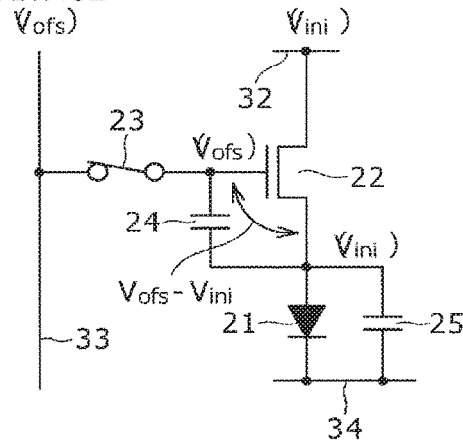

Then, since the writing scanning signal WS of the scanning line 31 transits from the low potential side to the high potential side at time $t_{12}$, the writing transistor 23 is placed into a conducting state as seen in FIG. 12C. At this time, since the reference potential $V_{ofs}$ is supplied from the signal outputting circuit 60 to the signal line 33, the gate potential $V_g$ of the driving transistor 22 becomes the reference potential $V_{ofs}$. Further, the source potential $V_s$ of the driving transistor 22 is the $V_{ini}$ sufficiently lower than the reference potential $V_{ofs}$.

At this time, the gate-source voltage $V_{gs}$ of the driving transistor 22 becomes $V_{ofs}-V_{ini}$. Here, if $V_{ofs}-V_{ini}$ is not higher than the threshold voltage $V_{th}$ of the driving transistor 22, then since a threshold value correction process hereinafter described cannot be carried out, it is necessary to set $V_{ofs}-V_{ini}$ to a potential relationship of $V_{ofs}-V_{ini}>V_{th}$.

A process of fixing the gate potential $V_g$ of the driving transistor 22 to the reference potential $V_{ofs}$ and fixing the source potential $V_s$ of the driving transistor 22 to the low potential $V_{ini}$ to initialize them is a preparation process, that is, a threshold value correction preparation process, before a threshold value correction process or threshold value correction operation hereinafter described. Accordingly, the reference potential $V_{ofs}$ and the low potential $V_{ini}$ are initialization potentials for the gate potential $V_g$ and the source potential $V_s$ of the driving transistor 22, respectively.

Threshold Value Correction Period

Figure 12D:
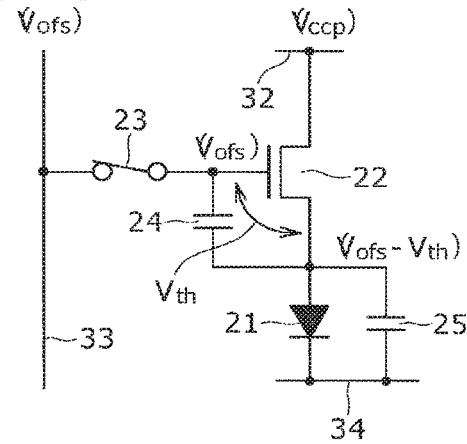

Then, after the power supply potential DS of the power supply line 32 changes over from the low potential $V_{ini}$ to the high potential $V_{ccp}$ at time $t_{13}$ as seen in FIG. 12D, a threshold value correction process is started in a state in which the gate potential $V_g$ of the driving transistor 22 is kept at the reference potential $V_{ofs}$. In particular, the source potential $V_s$ of the driving transistor 22 begins its rise toward the potential which is the difference of the threshold voltage $V_{th}$ from the gate potential $V_g$.

Here, for the convenience of description, a process of determining the reference potential $V_{ofs}$ for the gate potential $V_g$ of the driving transistor 22 as a reference and varying the source potential $V_s$ toward the potential which is the difference of the threshold voltage $V_{th}$ from the reference potential $V_{ofs}$ is called threshold value correction process. If this threshold value correction process proceeds, then the gate-source voltage $V_{gs}$ of the driving transistor 22 soon converges to the threshold voltage $V_{th}$ of the driving transistor 22. This voltage corresponding to the threshold voltage $V_{th}$ is retained into the retaining capacitor 24.

It is to be noted that, within a period within which the threshold value correction process is carried out, that is, within a threshold value correction period, in order to allow current to wholly flow toward the retaining capacitor 24 side but prevent current from flowing to the organic EL element 21 side, the potential $V_{cath}$ of the common power supply line 34 is set such that the organic EL element 21 is placed into a cutoff state.

Figure 13A:
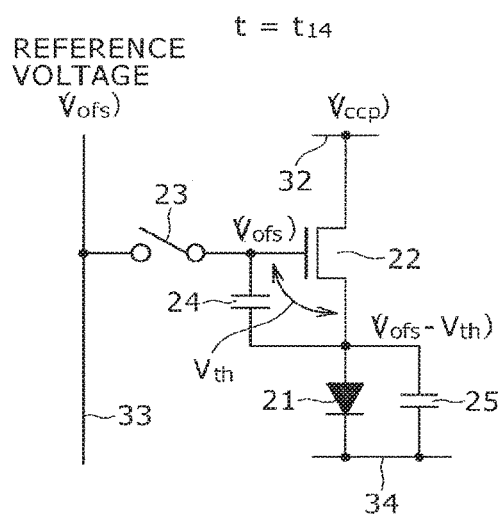
Figure 13B:
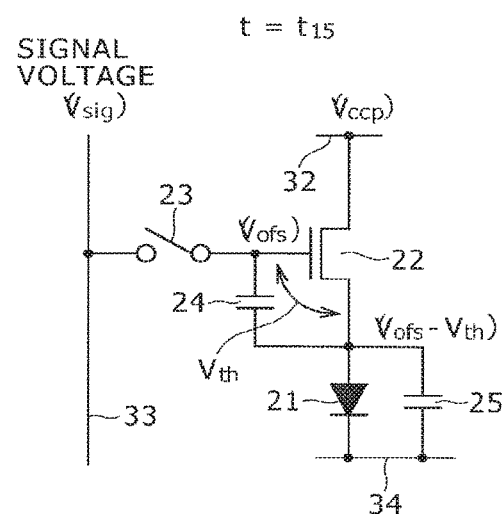
Figure 13C:
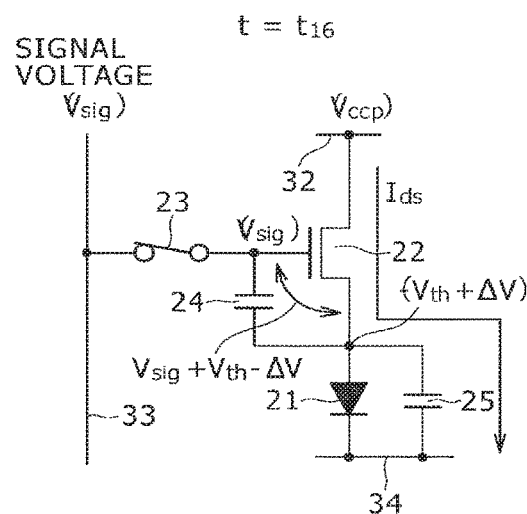

Then, the writing scanning signal WS of the scanning line 31 transits to the low potential side at time $t_{14}$, and thereupon, the writing transistor 23 is placed into non-conducting state as seen in FIG. 13A. At this time, the gate electrode of the driving transistor 22 enters a floating state by being electrically disconnected from the signal line 33. However, since the gate-source voltage $V_{gs}$ is equal to the threshold voltage $V_{th}$ of the driving transistor 22, the driving transistor 22 is in a cutoff state. Accordingly, drain-source current $I_{ds}$ does not flow to the driving transistor 22.

Signal Writing and Mobility Correction Period

Then at time $t_{15}$, the potential of the signal line 33 changes over from the reference potential $V_{ofs}$ to the signal voltage $V_{sig}$ of the video signal. Then at time $t_{16}$, the writing scanning signal WS of the scanning line 31 transits to the high potential side, whereupon the writing transistor 23 enters a conducting state and samples and writes the signal voltage $V_{sig}$ of the video signal into the pixel 20.

By the writing of the signal voltage $V_{sig}$ by the writing transistor 23, the gate potential $V_g$ of the driving transistor 22 becomes the signal voltage $V_{sig}$. Then, when the driving transistor 22 is driven by the signal voltage $V_{sig}$ of the video signal, the threshold voltage $V_{th}$ of the driving transistor 22 is canceled by the voltage corresponding to the threshold voltage $V_{th}$ retained in the retaining capacitor 24. Details of the principle of the threshold value cancellation are hereinafter described.

At this time, the organic EL element 21 is in a cutoff state, that is, in a high impedance state. Accordingly, the current which flows from the power supply line 32 to the driving transistor 22 in response to the signal voltage $V_{sig}$ of the video signal, that is, the drain-source current $I_{ds}$, flows into the equivalent capacitor of the organic EL element 21 and the auxiliary capacitor 25 thereby to start charging of the capacitors.

As the equivalent capacitor of the organic EL element 21 and the auxiliary capacitor 25 are charged, the source potential $V_s$ of the driving transistor 22 gradually rises as time passes. At this time, the dispersion of the threshold voltage $V_{th}$ of the driving transistor 22 among the pixels is canceled already, and consequently, the drain-source current $I_{ds}$ of the driving transistor 22 relies upon the mobility $\mu$ of the driving transistor 22. It is to be noted that the mobility $\mu$ of the driving transistor 22 is a mobility of a semiconductor thin film which configures the channel of the driving transistor 22.

Here, it is assumed that the rate of the retained voltage $V_{gs}$ of the retaining capacitor 24 to the signal voltage $V_{sig}$ of the video signal, that is, the write gain G, is 1 (ideal value). Thus, if the source potential $V_s$ of the driving transistor 22 rises to the potential of $V_{ofs}-V_{th}+\Delta V$, then the gate-source voltage $V_{gs}$ of the driving transistor 22 becomes $V_{sig}-V_{ofs}+V_{th}-\Delta V$.

In particular, the rise amount $\Delta V$ of the source potential $V_s$ of the driving transistor 22 acts so as to be subtracted from the voltage $V_{sig}-V_{ofs}+V_{th}$ retained in the retaining capacitor 24, or in other words, so as to discharge the photocharge of the retaining capacitor 24, and this signifies that a negative feedback is applied to the retaining capacitor 24. Accordingly, the rise amount $\Delta V$ of the source potential $V_s$ is a feedback amount in negative feedback.

By applying negative feedback to the gate-source voltage $V_{gs}$ by the feedback amount $\Delta V$ corresponding to the drain-source current $I_{ds}$ flowing to the driving transistor 22 in this manner, the dependency of the drain-source current $I_{ds}$ of the driving transistor 22 upon the mobility $\mu$ can be canceled. This cancellation process is a mobility correction process for correcting the dispersion of the mobility $\mu$ of the driving transistor 22 among the pixels.

More particularly, since the drain-source current $I_{ds}$ increases as the signal amplitude $V_{in}(=V_{sig}-V_{ofs})$ of the video signal to be written into the gate electrode of the driving transistor 22, also the absolute value of the feedback amount $\Delta V$ in negative feedback increases. Accordingly, the mobility correction process in accordance with the emitted light luminance level is carried out.

Further, if it is assumed that the signal amplitude $V_{in}$ of the video signal is fixed, then since the absolute value of the feedback amount $\Delta V$ increases as the mobility $\mu$ of the driving transistor 22 increases, the dispersion of the mobility $\mu$ among the pixels can be removed. Accordingly, the feedback amount $\Delta V$ in negative feedback can be regarded also as a correction amount of the mobility correction process. Details of the principle of the mobility correction are hereinafter described.

Light Emitting Period

Figure 13D:
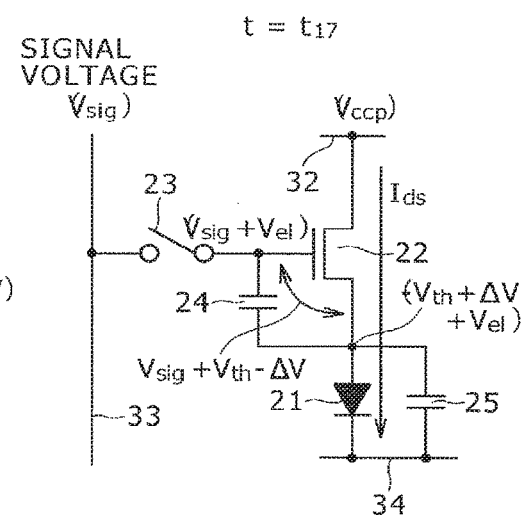

Then, the writing scanning signal WS of the scanning line 31 transits to the low potential side at time $t_{17}$, whereupon the writing transistor 23 is placed into a non-conducting state as seen in FIG. 13D. Consequently, the gate electrode of the driving transistor 22 is electrically disconnected from the signal line 33 and consequently placed into a floating state.

Here, when the gate electrode of the driving transistor 22 is in a floating state, since the retaining capacitor 24 is connected between the gate and the source of the driving transistor 22, also the gate potential $V_g$ varies in an interlocking relationship with the variation of the source potential $V_s$ of the driving transistor 22. The operation wherein the gate potential $V_g$ of the driving transistor 22 varies in an interlocking relationship with the variation of the gate potential $V_g$ is a bootstrap operation by the retaining capacitor 24.

Then, since the gate electrode of the driving transistor 22 is placed into a floating state and simultaneously drain-source current $I_{ds}$ of the driving transistor 22 begins to flow to the organic EL element 21, the anode potential of the organic EL element 21 rises in response to the current $I_{ds}$.

Then, if the anode potential of the organic EL element 21 exceeds $V_{thel}+V_{cath}$ then since driving current begins to flow to the organic EL element 21, the organic EL element 21 begins to emit light. The rise of the anode potential of the organic EL element 21 is no more than a rise of the source potential $V_s$ of the driving transistor 22. Then, as the source potential $V_s$ of the driving transistor 22 rises, also the gate potential $V_g$ of the driving transistor 22 rises in an interlocking relationship by a bootstrap operation of the retaining capacitor 24.

At this time, if it is assumed that the bootstrap gain is 1 (ideal value), then the rise amount of the gate potential $V_g$ is equal to a rise amount of the source potential $V_s$. Therefore, during a light emitting period, the gate-source voltage $V_{gs}$ of the driving transistor 22 is kept fixed at $V_{sig}-V_{ofs}+V_{th}-\Delta V$. Then, at time $t_{18}$, the potential of the signal line 33 changes over from the signal voltage $V_{sig}$ of the video signal to the reference potential $V_{ofs}$.

In the series of circuit operations described above, the processing operations of threshold value correction preparation, threshold value correction, writing of the signal voltage $V_{sig}$, that is, signal writing, and mobility correction are executed in one horizontal scanning period (1H). Further, the processing operations of signal writing and mobility correction are executed in parallel within the period from $t_6$ to time $t_7$.

Divisional Threshold Value Correction

It is to be noted here that, while the foregoing description is given taking a case wherein a driving method wherein a threshold value correction process is executed only once is adopted as an example, this driving method is a mere example and the driving method is not limited to the specific method. For example, in addition to a 1H period within which the threshold value correction process is carried out together with the mobility correction and signal writing processes, the threshold value correction process is executed divisionally by a plural number of times over a plurality of horizontal scanning periods executed within the 1H period. Thus, also it is possible to adopt a driving method which involves divisional threshold value correction.

With the driving method which involves divisional threshold value correction, even if the period of time allocated as one horizontal scanning period is shortened by increase of the number of pixels involved in enhancement of the definition, sufficient time can be assured over a plurality of horizontal scanning periods for a threshold value correction period. Accordingly, even if the time allocated as one horizontal scanning period becomes short, the threshold value correction process can be executed with certainty.

Principle of Threshold Value Cancellation

Here, the principle of threshold value cancellation or threshold value correction of the driving transistor 22 is described. Since the driving transistor 22 is designed so as to operate in its saturation region, it operates as a constant current source. Consequently, fixed drain-source current or driving current $I_{ds}$ given by the following expression is supplied from the driving transistor 22 to the organic EL element 21:

$$I_{ds}=(1/2)\cdot\mu(W/L)C_{OX}(V_{gs}-V_{th})^2 \quad (1)$$

where W is the channel width of the driving transistor 22, L the channel length and $C_{OX}$ the gate capacitance per unit area.

Figure 14A:
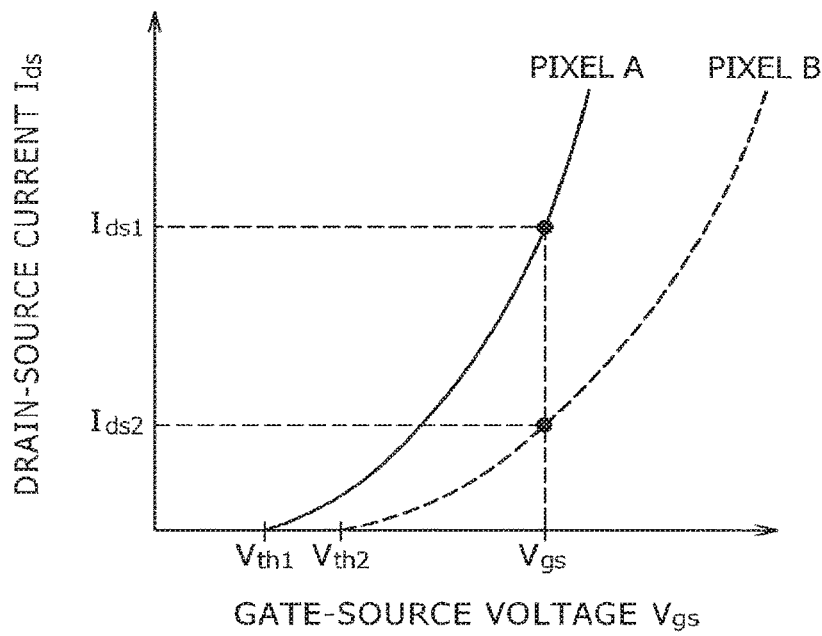
FIGS. 14A and 14B are characteristic diagrams illustrating a subject arising from a dispersion in threshold voltage of a driving transistor and another subject arising from a dispersion in mobility of the driving transistor, respectively.

FIG. 14A illustrates a characteristic of the drain-source current $I_{ds}$ with respect to the gate-source voltage $V_{gs}$ of the driving transistor 22. If the cancellation process or correction process for the dispersion of the threshold voltage $V_{th}$ of the driving transistor 22 among the pixels is not carried out as seen from the characteristic diagram of FIG. 14A, then when the threshold voltage $V_{th}$ is $V_{th1}$, the drain-source current $I_{ds}$ corresponding to the gate-source voltage $V_{gs}$ becomes $I_{ds1}$.

However, when the threshold voltage $V_{th}$ is $V_{th2}$ ($V_{th2}>V_{th1}$), the drain-source current $I_{ds}$ corresponding to the same gate-source voltage $V_{gs}$ becomes $I_{ds1}$ ($I_{ds2}<I_{ds1}$). In particular, if the threshold voltage $V_{th}$ of the driving transistor 22 varies, then the drain-source current $I_{ds}$ varies even if the gate-source voltage $V_{gs}$ is fixed.

On the other hand, in the pixel or pixel circuit 20 having the configuration described above, the gate-source voltage $V_{gs}$ of the driving transistor 22 upon light emission is $V_{sig}-V_{ofs}+V_{th}-\Delta V$. Accordingly, if this is substituted into the expression (1), then the drain-source current $I_{ds}$ is represented by the following expression (2):

$$I_{ds}=(1/2)\cdot\mu(W/L)C_{OX}(V_{sig}-V_{ofs}-\Delta V)^2 \quad (2)$$

In particular, the term of the threshold voltage $V_{th}$ of the driving transistor 22 is canceled, and the drain-source current $I_{ds}$ supplied from the driving transistor 22 to the organic EL element 21 does not rely upon the threshold voltage $V_{th}$ of the driving transistor 22. As a result, even if the threshold voltage $V_{th}$ of the driving transistor 22 varies among the pixels due to a dispersion in fabrication process, a time-dependent variation and so forth of the driving transistor 22, since the drain-source current $I_{ds}$ does not vary, the emitted light luminance of the organic EL element 21 can be kept fixed.

Principle of Mobility Correction

Figure 14B:
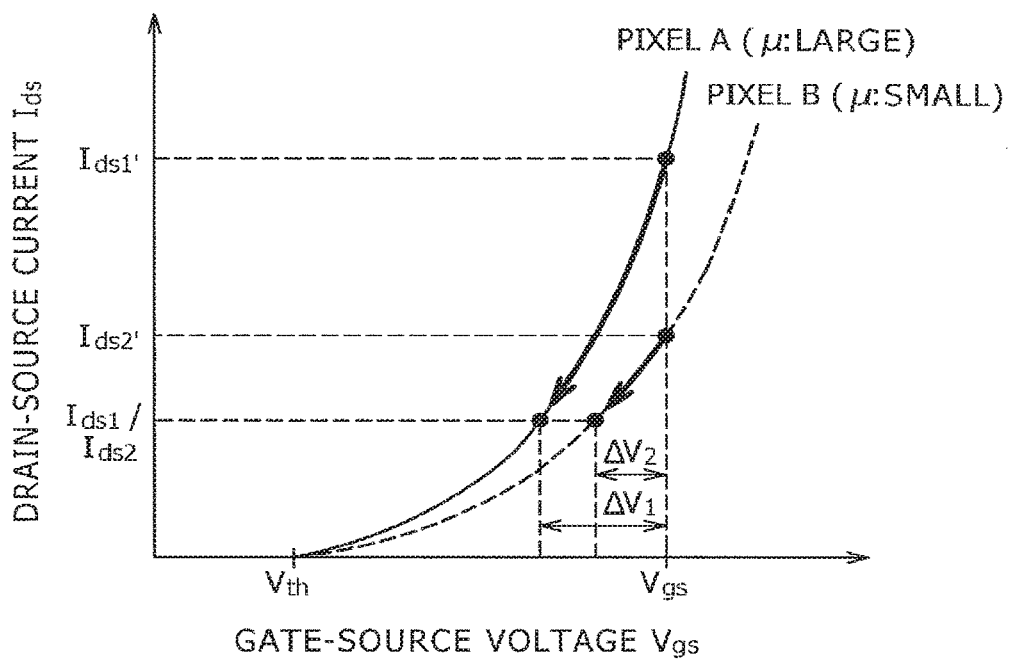

Now, the principle of mobility correction of the driving transistor 22 is described. FIG. 14B illustrates characteristic curves for comparison of a pixel A wherein the mobility μ of the driving transistor 22 is comparatively high and a pixel B wherein the mobility μ of the driving transistor 22 is comparatively low. In the case where the driving transistor 22 is configured from a polysilicon thin film transistor or the like, it cannot be avoided that the mobility μ disperses among pixels like between the pixel A and the pixel B.

For example, a case is considered wherein signal voltages $V_{in}(=V_{sig}-V_{ofs})$ of an equal level are written into the gate electrodes of the driving transistors 22 of the pixels A and B while the pixel A and the pixel B have a dispersion in mobility μ therebetween. In this instance, if correction of the mobility μ is not carried out, then a great difference appears between the drain-source current $I_{ds1}$' flowing through the pixel A having the high mobility μ and the drain-source current $I_{ds2}$' flowing through the pixel B having the low mobility μ. If a great difference appears in drain-source current $I_{ds}$ among the pixels arising from a dispersion in mobility μ among the pixels in this manner, then the uniformity of the screen image is damaged.

As apparent from the characteristic expression of the expression (1) given hereinabove, as the mobility μ increases, the drain-source current $I_{ds}$ increases. Accordingly, the feedback amount $\Delta V$ in negative feedback increases as the mobility μ increases. As seen from FIG. 14B, the feedback amount $\Delta V_1$ of the pixel A whose mobility μ is high is higher than the feedback amount $\Delta V_2$ of the pixel B whose mobility μ is low.

Therefore, by applying negative feedback to the gate-source voltage $V_{gs}$ by the feedback amount $\Delta V$ corresponding to the drain-source current $I_{ds}$ of the driving transistor 22 by the mobility correction process, the amount of application of negative feedback increases as the mobility μ increases. As a result, the dispersion of the mobility μ among the pixels can be corrected.

In particular, if correction by the feedback amount $\Delta V_1$ is applied to the pixel A whose mobility μ is high, then the drain-source current $I_{ds}$ decreases by a greater amount from $I_{ds1}$' to $I_{ds1}$. On the other hand, since the feedback amount $\Delta V_2$ to the pixel B whose mobility μ is low is small, the drain-source current $I_{ds}$ drops from $I_{ds2}$' to $I_{ds2}$ and does not drop by a great amount. As a result, the drain-source current $I_{ds1}$ of the pixel A and the drain-source current $I_{ds2}$ of the pixel B become substantially equal to each other, and consequently, the dispersion in mobility μ between the pixels is corrected.

In summary, where a pixel A and a pixel B which are different in mobility μ from each other are available, the feedback amount $\Delta V_1$ of the pixel A whose mobility μ is high is greater than the feedback amount $\Delta V_2$ of the pixel B whose mobility μ is low. In other words, as the mobility μ increases, the feedback amount $\Delta V$ increases and the decreasing amount of the drain-source current $I_{ds}$ increases.

Accordingly, by applying negative feedback to the gate-source voltage $V_{gs}$ by the feedback amount $\Delta V$ corresponding to the drain-source current $I_{ds}$ of the driving transistor 22, the current value of the drain-source current $I_{ds}$ is uniformized among the pixels having different values of the mobility $\mu$. As a result, the dispersion in mobility $\mu$ among the pixels can be corrected. Thus, a process of applying negative feedback to the gate-source voltage $V_{gs}$ of the driving transistor 22, that is, to the retaining capacitor 24, by the feedback amount or correction amount $\Delta V$ corresponding to the current flowing through the driving transistor 22, that is, corresponding to the gate-source voltage $V_{gs}$, is the mobility correction process.

2-3. Example of the Configuration of the Driving Circuit Sections

Here, an example of the configuration of the circuit sections disposed around the pixel array section 30, that is, the driving circuits sections for driving the pixels 20 of the pixel array section 30, is described.

A. Writing Scanning Circuit

First, as one of the driving circuit sections, the writing scanning circuit 40 for carrying out sequential selection scanning of the pixels 20 of the pixel array section 30 in a unit of a row upon writing of the signal voltage $V_{sig}$/reference potential $V_{ofs}$ into the pixels 20 is described by way of an example.

Figure 15A:
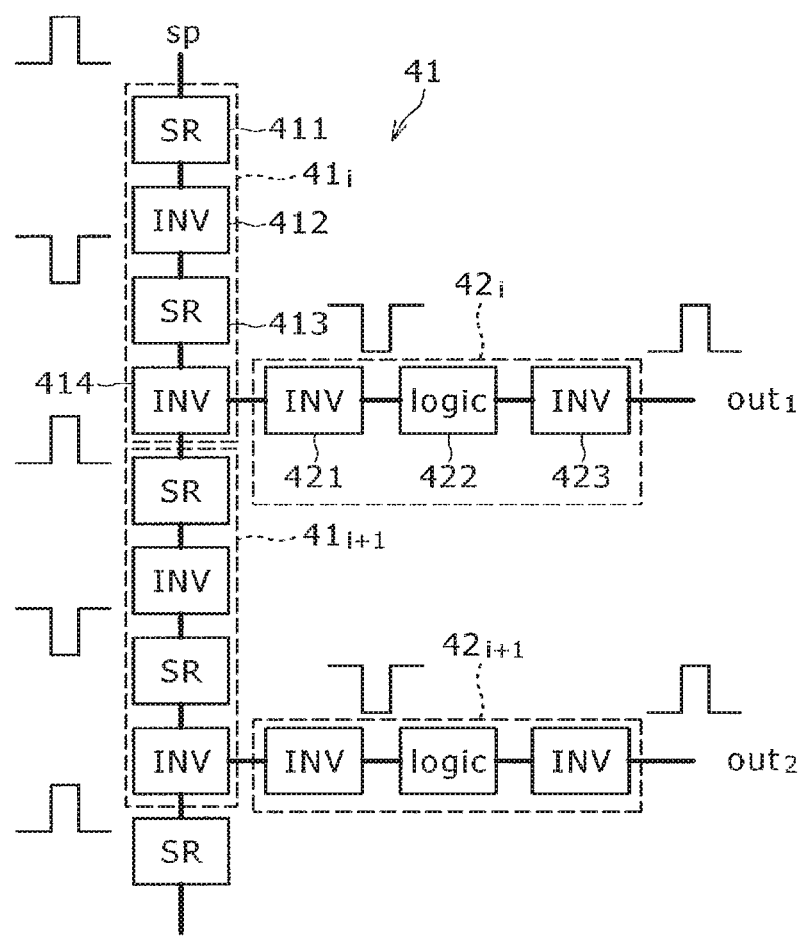
FIG. 15A is a block diagram showing an example of a configuration of a writing scanning circuit and FIG. 15B is a circuit diagram showing an example of a circuit of a shift register which configures the writing scanning circuit.
Figure 15B:
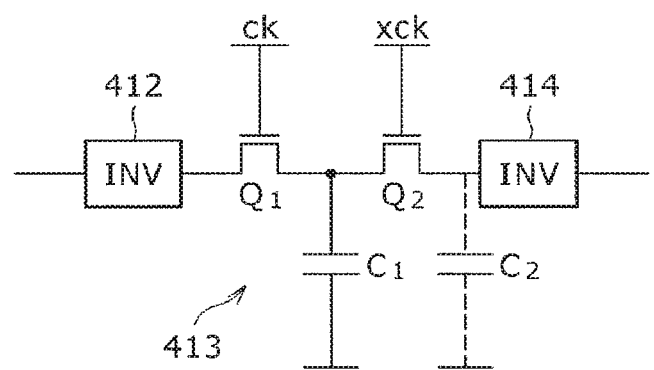

FIGS. 15A and 15B show an example of a configuration of the writing scanning circuit 40, and particularly FIG. 15A shows an example of the configuration of the writing scanning circuit 40 and FIG. 15B shows an example of a circuit of a shift register which configures the writing scanning circuit 40.

Referring first to FIG. 15A, the writing scanning circuit 40 basically includes, as a principal component thereof, a shift register circuit 41 for successively shifting or transferring a start pulse sp in synchronism with a clock pulse ck not shown. Further, the writing scanning circuit 40 includes buffer circuits . . . , $42_i$, $42_{i+1}$, . . . for individual transfer stages or unit circuits . . . , $41_i$, $41_{i+1}$, . . . of the shift register circuit 41 corresponding to the rows of the pixel array section 30.

Here, while the shift register circuit 41 shown is configured such that the two transfer stages $41_i$ and $41_{i+1}$ of the ith and i+1th rows, actually the shift register circuit 41 includes a number of transfer stages $41_1$ to $41_m$ equal to the number of rows of the pixel array section 30 connected in cascade connection. Each transfer stage of the shift register circuit 41, for example, the transfer stage $41_i$ of the ith row, includes a shift register (SR) 411, an inverter (INV) 412, another shift register 413 and another inverter 414 connected in cascade connection to form a unit circuit.

A particular circuit example of the inverters 412 and 414 is hereinafter described. Referring to FIG. 15B, the shift register 413 is configured from a transistor $Q_1$ which operates with the clock pulse ck, another transistor $Q_2$ which operates with another clock pulse xck and a capacitor $C_1$. A parasitic capacitor $C_2$ exists between an output terminal of the shift register 413 and an input terminal of the inverter 414.

Referring back to FIG. 15A, the buffer circuit $42_i$ is configured from an inverter 421, a logic circuit 422 and another inverter 423 connected in cascade connection. In this manner, each of the transfer stages $41_i$ and $41_i+_1$ of the shift register circuit 41 and the buffer circuits 42 ($42_i$ and $42_{i+1}$) is configured using an inverter circuit.

B. Inverter Circuit of a One-Sided Channel Transistor

Incidentally, upon fabrication of the driving circuit sections such as the writing scanning circuit 40, if the driving circuit sections are configured using transistors of a one-sided channel (only of an N channel or of a P channel), then the fabrication cost can be reduced in comparison with that in an alternative case wherein they are configured using both-sided channels. Accordingly, in order to reduce the cost of the display apparatus 10, for example, in the writing scanning circuit 40, inverter circuits which configure the shift register circuit 41 or the buffer circuits 42 is preferably configured using transistors of a one-sided channel.

In the case where an inverter circuit is configured using transistors of a one-sided channel, in order to make circuit operation of the inverter circuit sure, a circuit configuration based on a combination of transistors of a one-sided channel and a capacitance element is adopted. In the following, for example, an inverter circuit formed from a combination of transistors of a one-sided channel and capacitance elements to be used as the inverters 412 and 414 which configure the shift register circuit 41 is described.

Circuit Configuration

Figure 16A:
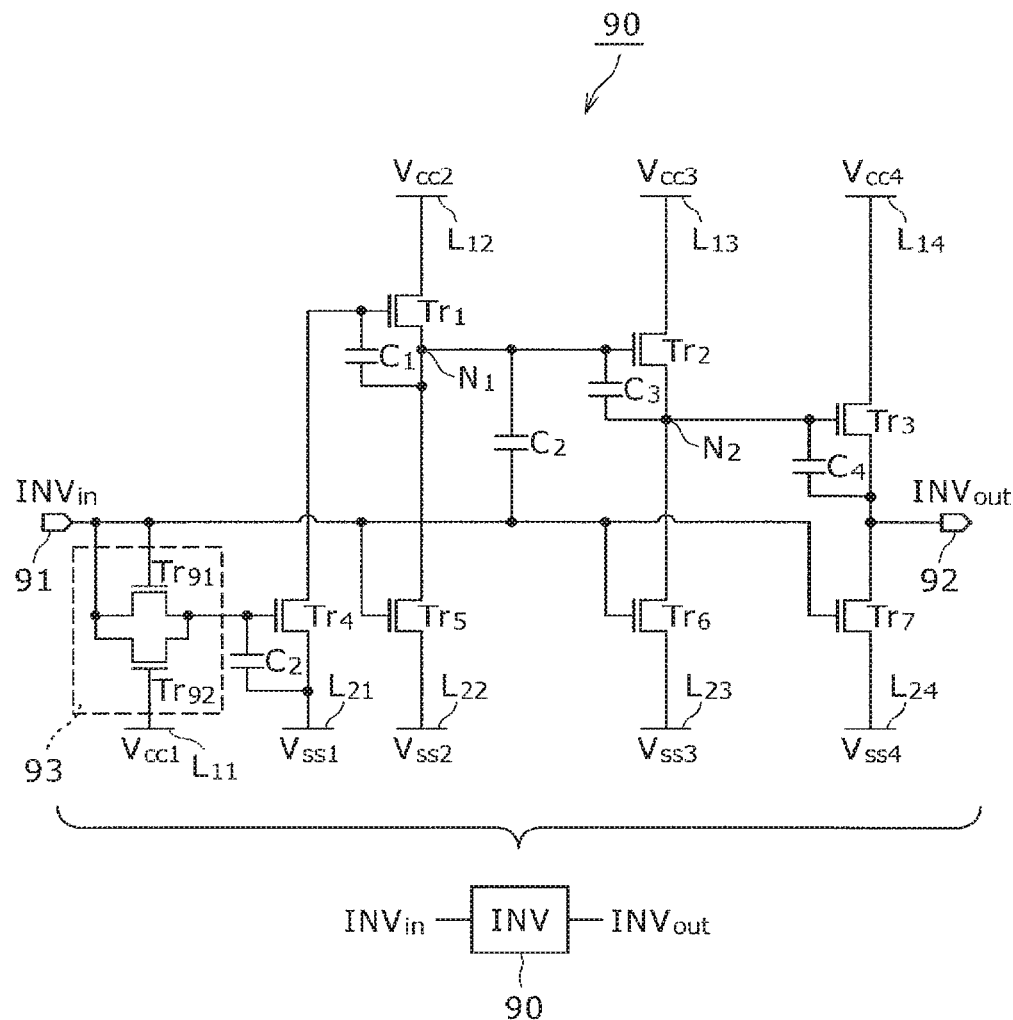
FIG. 16A is a circuit diagram showing an example of a circuit configuration of an inverter circuit configured from a combination of one-sided channel transistors and capacitance elements and FIG. 16B is a waveform diagram showing waveforms of an input pulse signal and an output pulse signal of the inverter circuit.
Figure 16B:
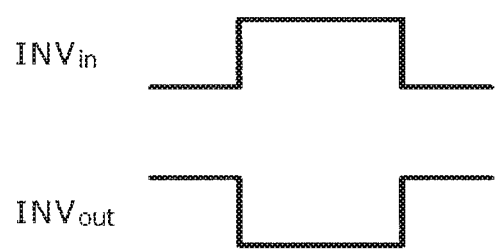

FIGS. 16A and 16B show an inverter circuit formed from a combination of transistors of a one-sided channel and capacitance elements, and particularly FIG. 16A shows an example of the circuit configuration and FIG. 16B illustrates waveforms of an input pulse signal $INV_{in}$ and the output pulse signal $INV_{out}$.

The inverter circuit 90 in the present circuit example substantially inverts the input pulse signal $INV_{in}$ inputted thereto through an input terminal 91 and outputs a pulse signal $INV_{out}$ of a phase opposite to that of the input pulse signal $INV_{in}$ from an output terminal 92. This inverter circuit 90 uses, as power supply voltages, for example, four power supply voltages $V_{cc1}$, $V_{cc2}$, $V_{cc3}$ and $V_{cc4}$ for the positive side and, for example, four power supply voltages $V_{ss1}$, $V_{ss2}$, $V_{ss3}$ and $V_{ss4}$ for the negative side. However, the power supply voltages mentioned here are a mere example, and the power supply voltages are not limited to them. A smaller number of power supply voltages may be used, or it is possible to use one power supply voltage for each of the positive and negative sides.

The inverter circuit 90 is configured such that it includes, for example, seven transistors $Tr_1$ to $Tr_7$, five capacitance element $C_1$ to $C_5$ and a delay circuit 93. The seven transistors $Tr_1$ to $Tr_7$ are MOS (Metal Oxide Semiconductor) thin film transistors, that is, TFTs, of the same channel or one-sided channel such as, for example, the N channel. While it is described here that transistors only of the N channel are used as the transistors $Tr_1$ to $Tr_7$, also it is possible to use transistors only of the P channel.

The transistor $Tr_1$ is connected at the drain electrode thereof to a power supply line $L_{12}$ of the positive side power supply voltage $V_{cc2}$ and at the source electrode thereof to a node $N_1$ and receives a voltage corresponding to an input voltage, that is, the input pulse signal $INV_{in}$, inputted through the input terminal 91 as a gate input. The transistor $Tr_2$ is connected at the drain electrode thereof to a power supply line $L_{13}$ of the positive side power supply voltage $V_{cc3}$, at the source electrode thereof to a node $N_2$ and at the gate electrode thereof to the node $N_1$. The transistor $Tr_3$ is connected at the drain electrode thereof to a power supply line $L_{14}$ of the positive side power supply voltage $V_{cc4}$, at the source electrode thereof to an output terminal 92 and at the gate electrode thereof to the node $N_2$.

The delay circuit 93 is configured, for example, from two transistors $Tr_{91}$ and $Tr_{92}$ connected in parallel to each other.

Naturally, the two transistors $Tr_{91}$ and $Tr_{92}$ are N-channel MOS transistors similarly to the transistors $Tr_1$ to $Tr_7$. The transistors $Tr_{91}$ and $Tr_{92}$ are connected commonly at one of the electrodes, that is, at the source electrode or the drain electrode thereof, and the one electrode serves as a circuit input terminal of the delay circuit 93 while the other electrode, that is, the drain electrode or the source electrode, serves as a circuit output terminal of the delay circuit 93.

In the delay circuit 93, the circuit input terminal is connected to the input terminal 91. Also the transistor $Tr_{91}$ is connected at the gate electrode thereof to the input terminal 91. The transistor $Tr_{92}$ is connected at the gate electrode thereof to a power supply line $L_{11}$ of the positive side power supply voltage $V_{cc1}$.

The transistor $Tr_4$ is connected at the drain electrode thereof to the gate electrode of the transistor $Tr_1$, at the gate electrode thereof to a power supply line $L_{21}$ of the negative side power supply voltage $V_{ss1}$ and at the gate electrode thereof to the circuit output terminal of the delay circuit 93. The transistor $Tr_5$ is connected at the drain electrode thereof to the node $N_1$ and at the source electrode thereof to a power supply line $L_{22}$ of the negative side power supply voltage $V_{ss2}$. In other words, the transistor $Tr_5$ is connected in series to the transistor $Tr_1$ and connected at the gate electrode thereof to the input terminal 91.

The transistor $Tr_6$ is connected at the drain electrode thereof to the node $N_2$ and at the source electrode thereof to a power supply line $L_{23}$ of the negative side power supply voltage $V_{ss3}$. In other words, the transistor $Tr_6$ is connected in series to the transistor $Tr_2$ and connected at the gate electrode thereof to the input terminal 91. The transistor $Tr_7$ is connected at the drain electrode thereof to the output terminal 92, at the source electrode thereof to a power supply line $L_{24}$ of the negative side power supply voltage $V_{ss4}$ and at the gate electrode thereof to the input terminal 91.

The capacitor $C_1$ is connected at one terminal thereof to the gate electrode of the transistor $Tr_1$ and at the other terminal thereof to the node $N_1$. In other words, the capacitor $C_1$ is connected between the gate and the source of the transistor $Tr_1$. The parasitic capacitor $C_2$ is connected at one electrode thereof to the node $N_1$ and at the other electrode thereof to the input terminal 91. The node $N_1$ is a common connection node of the transistor $Tr_1$ and the transistor $Tr_5$.

The capacitance element $C_3$ is connected at one electrode thereof to the gate electrode of the transistor $Tr_2$ and at the other electrode thereof to the node $N_2$. The capacitance element $C_4$ is connected at one terminal thereof to the gate electrode of the transistor $Tr_3$ and at the other electrode thereof to the output terminal 92. The capacitance element $C_5$ is connected at one electrode thereof to the gate electrode of the transistor $Tr_4$ and at the other electrode thereof to the power supply line $L_{21}$ of the negative side power supply voltage $V_{ss1}$.

Here, the delay circuit 93 configured from the transistors $Tr_{91}$ and $Tr_{92}$ has a role of a high resistance element which interconnects the input terminal 91 and the gate electrode of the transistor $Tr_4$. Consequently, the input pulse signal $INV_{in}$ inputted through the input terminal 91 passes through the delay circuit 93, whereupon a variation of the potential of the input pulse signal $INV_{in}$ is transmitted after a delay in time to the gate electrode of the transistor $Tr_4$. The delay amount of the delay circuit 93 can be controlled by changing the voltage value of the positive side power supply voltage $V_{cc1}$ and the capacitance value of the capacitance element $C_5$.

The transistor $Tr_1$ electrically connects or disconnects the power supply line $L_{12}$ of the positive side power supply voltage $V_{cc2}$ to or from the node $N_1$ in response to a voltage across the capacitor $C_1$. The transistor $Tr_2$ electrically connects or disconnects the power supply line $L_{13}$ of the positive side power supply voltage $V_{cc3}$ and the node $N_2$ in response to the potential difference between the potential of the node $N_1$ and the potential of the node $N_2$, that is, in response to a voltage across the capacitance element $C_3$. The transistor $Tr_3$ electrically connects or disconnects the power supply line $L_{14}$ of the positive side power supply voltage $V_{cc4}$ to or from output terminal 92 in response to the potential difference between the potential of the node $N_2$ and the potential of the output terminal 92, that is, in response to a voltage across the capacitance element $C_4$.

The transistor $Tr_4$ electrically connects or disconnects the gate electrode of the transistor $Tr_1$ to or from the power supply line $L_{21}$ of the negative side power supply voltage $V_{ss1}$ in response to the potential difference between the potential at the output terminal of the delay circuit 93 and the negative side power supply voltage $V_{ss1}$, that is, in response to a voltage across the capacitance element $C_5$. The transistor $Tr_5$ electrically connects or disconnects the node $N_1$ to or from the power supply line $L_{22}$ of the negative side power supply voltage $V_{ss2}$ in response to the potential difference between the potential of the input terminal 91 and the negative side power supply voltage $V_{ss2}$. The transistor $Tr_6$ electrically connects or disconnects the node $N_2$ to or from the power supply line $L_{22}$ of the negative side power supply voltage $V_{ss3}$ in response to the potential difference between the potential of the input terminal 91 and the negative side power supply voltage $V_{ss3}$. The transistor $Tr_7$ electrically connects or disconnects the output terminal 92 to or from the power supply line $L_{24}$ of the negative side power supply voltage $V_{ss4}$ in response to the potential difference between the potential of the input terminal 91 and the negative side power supply voltage $V_{ss4}$.

Circuit Operation

Now, circuit operation when the input pulse signal $INV_{in}$ inputted through the input terminal 91 to the inverter circuit 90 having the configuration described above is placed into an active state or high potential state and into an inactive state or low potential state is described.

When the Input Pulse Signal $INV_{in}$ is Placed into an Active State:

If the input pulse signal $INV_{in}$ is placed into an active state, then the gate potential of the transistor $Tr_7$ is placed into a high potential state and the transistor $Tr_7$ is placed into a conducting state. Therefore, the negative side power supply voltage $V_{ss4}$ is led out as the low potential of the output pulse signal $INV_{out}$ from the output terminal 92. Simultaneously, also the transistors $Tr_5$ and $Tr_6$ are placed into conducting state, and consequently, the potentials at the nodes $N_1$ and $N_2$ are fixed to the negative side potentials $V_{ss2}$ and $V_{ss3}$, respectively.

Consequently, both of the transistors $Tr_2$ and $Tr_3$ are placed into a non-conducting state. Further, the transistor $Tr_4$ is placed into a conducting state in response to a delay output of the delay circuit 93, and consequently, the gate potential of the transistor $Tr_1$ is fixed to the negative side power supply voltage $V_{ss1}$. Consequently, also the transistor $Tr_1$ is placed into a non-conducting state. In other words, when the input pulse signal $INV_{in}$ is placed into an active state, then all of the positive side transistors $Tr_1$, $Tr_2$ and $Tr_3$ are placed into a non-conducting state.

When the Input Pulse Signal $INV_{in}$ is Placed into an Inactive State:

If the input pulse signal $INV_{in}$ is placed into an inactive state, then all of the transistors $Tr_5$, $Tr_6$ and $Tr_7$ on the negative potential side are simultaneously placed into a non-conducting state. In addition, the potential at the node $N_1$, that is, the gate potential of the transistor $Tr_2$, drops by capacitive coupling of the parasitic capacitor $C_2$ in accordance with the variation amount when the input pulse signal $INV_{in}$ transits from the high potential to the low potential.

At the instant of the potential drop by the capacitive coupling, the gate potential of the transistor $Tr_4$ keeps a high potential state due to a delay by the delay circuit 93, and therefore, the gate potential of the transistor $Tr_1$ is in the state of the negative side power supply voltage $V_{ss1}$. Accordingly, the gate-source voltage $V_{gs}$ of the transistor $Tr_1$ increases in response to the potential drop at the node $N_1$ until it exceeds the threshold voltage, whereupon the transistor $Tr_1$ is placed into a conducting state. Consequently, the potential at the node $N_1$ rises to the positive side power supply voltage $V_{cc1}$.

Consequently, since also the gate-source voltage $V_{gs}$ of the transistor $Tr_2$ increases, also the transistor $Tr_2$ is placed into a conducting state. As a result, the potential at the node $N_2$ rises to the positive side power supply voltage $V_{cc2}$ and also the gate-source voltage $V_{gs}$ of the transistor $Tr_2$ increases, and consequently, the transistor $Tr_3$ is placed into a conducting state following the transistor $Tr_2$. Then, when the transistor $Tr_3$ is placed into a conducting state, the positive side power supply voltage $V_{cc4}$ is led out as a positive potential of the pulse signal $INV_{out}$ from the output terminal 92.

Here, in order to allow the transistor $Tr_1$ to be placed into a conducting state more rapidly in response to a drop of the gate potential of the transistor $Tr_2$ by the capacitive coupling of the parasitic capacitor $C_2$, the capacitance value of the parasitic capacitor $C_2$ is set to a rather high level. Then, if the transistor $Tr_1$ enters a conducting state rapidly, then the transition timing, that is, the rising/falling timing, of the pulse signal $INV_{out}$ can be defined more accurately.

The transition timing of the output pulse signal $INV_{out}$ defines the pulse width of output pulse signal $INV_{out}$. Then, in the case where the driving circuit section is the writing scanning circuit 40, the output pulse signal $INV_{out}$ is used as a reference signal for generation of the writing scanning signal WS. Accordingly, the pulse width of the output pulse signal $INV_{out}$ makes a reference for the determination of the pulse width of the writing scanning signal WS and makes a reference for the determination of the operation time of the mobility correction process described hereinabove, that is, the mobility correction time.

Here, even if the pulse width of the writing scanning signal WS when the optimum mobility correction time is long and the pulse width of the writing scanning signal WS when the optimum mobility correction time is short exhibit an equal amount or time period of dispersion, the dispersion of the pulse width of the writing scanning signal WS when the optimum mobility correction time is short is relatively great. Then, the dispersion of the pulse width of the writing scanning signal WS makes a luminance dispersion and makes a cause of deterioration of the picture quality. Also from such a point of view, it is significant to set the capacitance value of the parasitic capacitor $C_2$ to a high level to allow the transistor $Tr_1$ to enter a conducting state rapidly thereby to accurately define the transition timing of the output pulse signal $INV_{out}$ which makes a reference for the determination of the mobility correction time.

As apparent from the foregoing description of the circuit operation, in the inverter circuit 90 configured from transistors of a one-sided channel, in order to make circuit operation sure, the parasitic capacitor $C_2$ for dropping the potential of the node $N_1$ by capacitive coupling is used. In addition to the parasitic capacitor $C_2$, also the capacitance elements $C_1$, $C_2$ and $C_4$ for retaining the gate-source voltage $V_{gs}$ of the transistors $Tr_1$, $Tr_2$ and $Tr_3$ are used. The capacitance elements $C_1$ to $C_4$ are used in an inverter circuit configured from transistors of a one-sided channel.

The inverter circuit 90 described above which is configured from a combination of transistors of a one-sided channel and capacitance elements can be used not only as the inverters 412 and 414 which configure the shift register circuit 41 of the writing scanning circuit 40 show in FIG. 15A but also as the inverters 421, 423 and so forth which configure the buffer circuits 42. Since also the power supply scanning circuit 50 is configured basically similarly to the writing scanning circuit 40, the inverter circuit 90 can be used also as an inverter which configures the power supply scanning circuit 50.

C. Signal Outputting Circuit

Now, as one of the driving circuit sections, the signal outputting circuit 60 which selectively outputs a signal voltage $V_{sig}$/reference potential $V_{ofs}$ in accordance with luminance information to the pixels 20 of a pixel row selectively scanned by the writing scanning circuit 40 is described.

Figure 17:
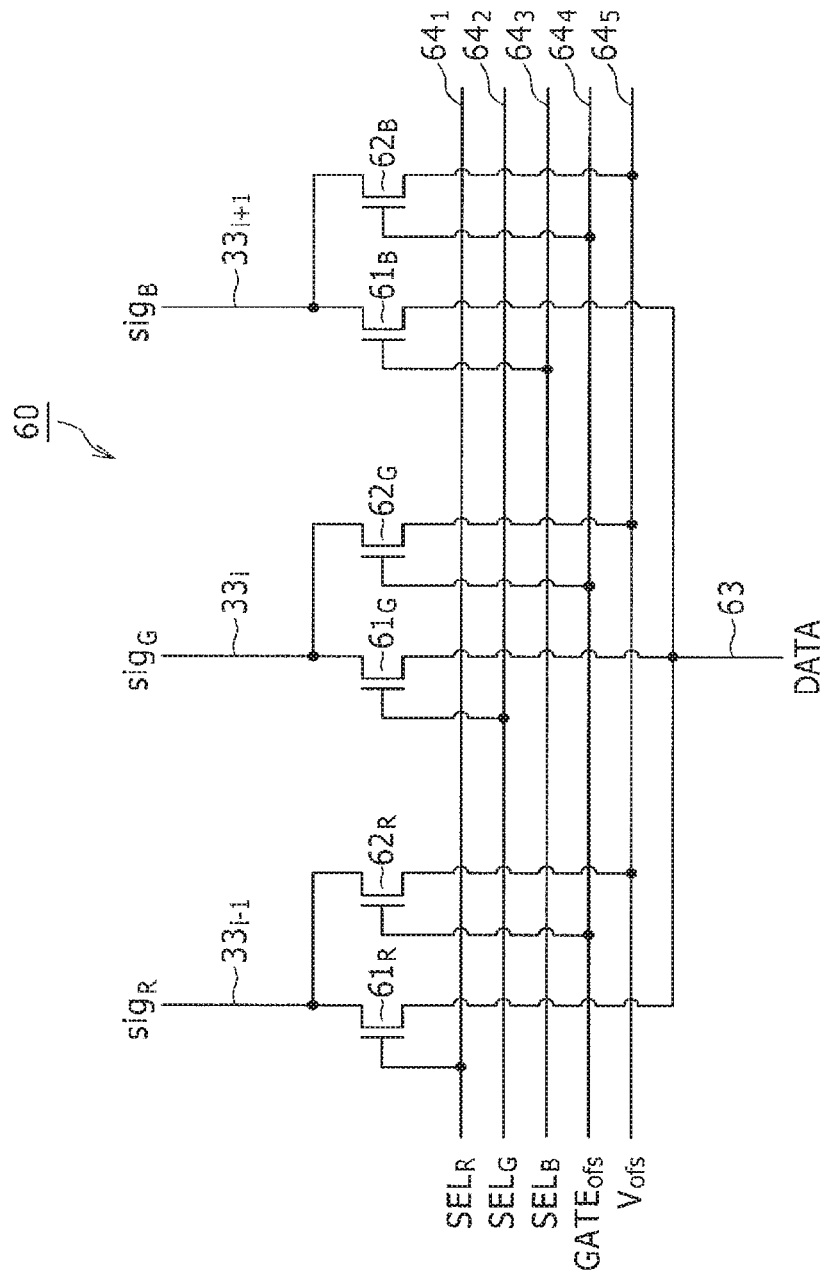
FIG. 17 is a circuit diagram showing an example of a configuration of a signal outputting circuit.

FIG. 17 shows an example of a configuration of the signal outputting circuit 60. The signal outputting circuit 60 of the present example adopts a time-divisional driving method or selector method wherein a video signal DATA supplied in a time sequence through a data line is supplied time-divisionally in a unit of a plurality of pixel columns. Here, a time-divisional driving method wherein a video signal DATA of RGB is supplied time-divisionally in a unit of three pixel columns or signal lines corresponding to R, G and B is described as an example.

Referring to FIG. 17, two selection switches $61_R$ and $62_R$ are connected commonly at an output terminal thereof to one end of a signal line $33_{i-1}$ of R. Two selection switches $61_G$ and $62_G$ are connected commonly at an output terminal thereof to en end of a signal line $33_i$ of G. Two selection switches $61_B$ and $62_B$ are connected commonly at an output terminal thereof to an end of the signal line $33_{i+1}$ of B.

The selection switches $61_R$, $61_G$ and $61_B$ and the selection switches $62_R$, $62_G$ and $62_B$ are configured, for example, from an Nch MOS transistor. However, the selection switches $61_R$, $61_G$ and $61_B$ and the selection switches $62_R$, $62_G$ and $62_B$ may otherwise be configured from a Pch MOS transistor or else may be configured from Nch MOS transistors and Pch MOS transistors connected in parallel.

The video signal DATA is a time-sequential signal by which signal voltages of RGB are supplied, for example, in the order of R, G and B, and is applied commonly to input terminals of the selection switches $61_R$, $61_G$ and $61_B$ from a driver IC or signal generation section not shown through a data line 63. The reference potential $V_{ofs}$ is applied commonly to input terminals of the selection switches $62_R$, $62_G$ and $62_B$ from a reference potential generation section not shown through a signal line $64_5$.

The selection switches $61_R$, $61_G$ and $61_B$ are connected at the gate thereof to control lines $64_1$, $64_2$ and $64_3$, respectively. The selection switches $62_R$, $62_G$ and $62_B$ are connected at the gate thereof commonly to a control line $64_4$. To the control lines $64_1$, $64_2$, $64_3$ and $64_4$, switch control signals $SEL_R$, $SEL_G$, $SEL_B$ and $GATE_{ofs}$ are applied, respectively, from a timing generation section not shown.

The switch control signal $SEL_R$ is rendered active, that is, placed into a high level, in synchronism with the signal voltage of R from within the time-sequential signal. The switch control signal $SEL_G$ is rendered active in synchronism with the signal voltage of G from within the time-sequential signal. The switch control signal $SEL_B$ is rendered active in synchronism with the signal voltage of B from within the time-sequential signal. The switch control signal $GATE_{ofs}$ is rendered active at a writing timing of the reference potential $V_{ofs}$ described hereinabove.

In the configuration described above, the selection switch $61_R$ is placed into a conducting state in response to the switch control signal $SEL_R$ to select the signal voltage of R and outputs the signal voltage of R to the signal line $33_{i-1}$. The selection switch $61_G$ is placed into a conducting state in response to the switch control signal $SEL_G$ to select the signal voltage of G and outputs the signal voltage of G to the signal line $33_i$. The selection switch $61_B$ is placed into a conducting state in response to the switch control signal $SEL_B$ to select the signal voltage of B and outputs the signal voltage of B to the signal line $33_{i+1}$. The selection switches $62_R$, $62_G$ and $62_B$ are placed into a conducting state in response to the switch control signal $GATE_{ofs}$ to select and output the reference potential $V_{ofs}$ to the signal lines $33_i$ and $33_{i+1}$, respectively.

In the organic EL display apparatus $10_A$ according to the present application described above, the writing scanning circuit 40, power supply scanning circuit 50 and signal outputting circuit 60 correspond to the peripheral driving sections $80_A$ to $80_C$ of the display apparatus 10 in the embodiment described hereinabove, respectively (refer to FIGS. 1, 4A, 4B and 7). Then, for example, in FIG. 7, in order to electrically connect the peripheral driving sections $80_A$ to $80_C$ and the outside of the substrate to each other, the pad portions $84_A$ and $84_B$, pad portion group $84_C$ and pads $84_D$ and $84_E$ are used.

Figure 18:
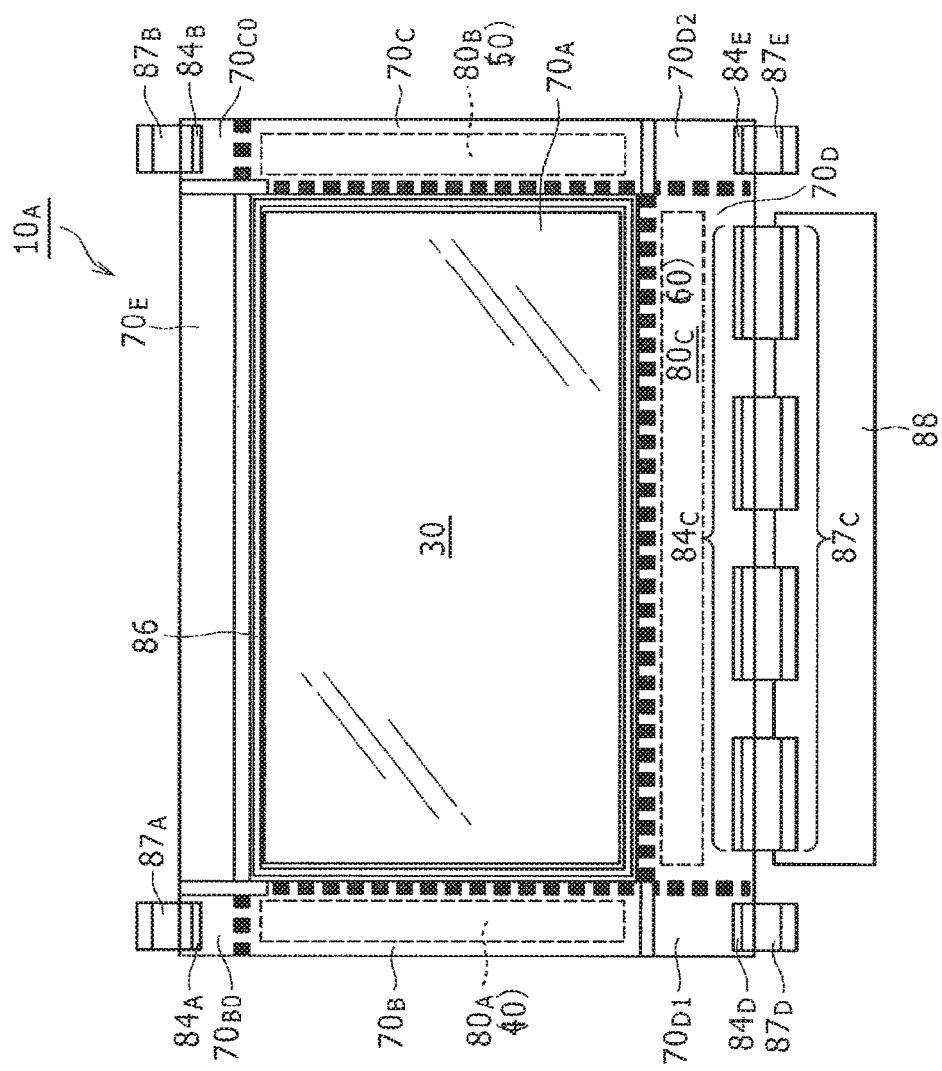
FIG. 18 is a schematic top plan view showing an example of a configuration of electrical connection to the outside of the substrate in the case where a scanning circuit section is provided in the panel.

In particular, referring to FIG. 18, the peripheral driving section $80_A$ mounted on the substrate end portion $70_B$ corresponds to the writing scanning circuit 40; the peripheral driving section $80_B$ mounted on the board end portion $70_C$ corresponds to the power supply scanning circuit 50; and the peripheral driving section $80_C$ mounted on the substrate end portion $70_D$ corresponds to the signal outputting circuit 60. FIG. 18 corresponds to FIG. 7.

The writing scanning circuit 40 which is the peripheral driving section $80_A$ is electrically connected, for example, at a pad portion $84_A$ provided at an upper end portion $70_{B0}$ of the substrate end portion $70_B$, to the outside of the substrate, for example, through a flexible board $87_A$. Then, to the writing scanning circuit 40, a power supply voltage and the clock pulse ck, start pulse sp and so forth described hereinabove are inputted from the outside of the substrate through the flexible board $87_A$ and the pad portion $84_A$.

The power supply scanning circuit 50 which is the peripheral driving section $80_B$ is electrically connected, for example, at a pad portion $84_B$ provided at an upper end portion $70_{C0}$ of the substrate end portion $70_C$, to the outside of the substrate, for example, through a flexible board $87_B$. Then, to the power supply scanning circuit 50, a power supply voltage and the clock pulse ck, start pulse sp and so forth described hereinabove are inputted from the outside of the substrate through the flexible board $87_B$ and the pad portion $84_B$ similarly to the writing scanning circuit 40.

The signal outputting circuit 60 which is the peripheral driving section $80_C$ is electrically connected, at the pad portion group $84_C$ provided on the substrate end portion $70_D$, to a driver IC 88, which is a signal supplying source provided on the outside of the substrate, for example, through a flexible board group $87_g$. Then, to the signal outputting circuit 60, the signal voltage $V_{sig}$ of a video signal is inputted from the driver IC 88 through the flexible board group $87_C$ and the pad portion group $84_C$.

Further, the signal outputting circuit 60 is electrically connected, at the pad portions $84_D$ and $84_E$ provided at the opposite end portions $70_{D1}$ and $70_{D2}$ of the substrate end portion $70_D$, to the outside of the substrate, for example, through the flexible boards $87_D$ and $87_E$, respectively. Then, to the signal outputting circuit 60, signals for controlling the signal outputting circuit 60 are inputted from the outside of the substrate through the flexible boards $87_D$ and $87_E$ and the pad portions $84_D$ and $84_E$.

In particular, if it is assumed that the signal outputting circuit 60 adopts the time-divisional driving method as seen from FIG. 17, then gate controlling signals for controlling the transistors which configure the selection switches $61_R$, $61_G$ and $61_B$ and the selection switches $62_R$, $62_G$ and $62_B$ are inputted. Here, the gate controlling signals are the switch control signals $SEL_R$, $SEL_G$, $SEL_B$ and $GATE_{ofs}$ described hereinabove. To the signal outputting circuit 60, the reference potential $V_{ofs}$ is inputted from the outside of the substrate through the flexible boards $87_D$ and $87_E$ and the pad portions $84_D$ and $84_E$ in addition to the gate controlling signals.

Here, in the case where the peripheral driving section $80_C$ particularly is the signal outputting circuit 60, the pad portion group $84_C$ for fetching a video signal from the outside of the substrate for each pixel column of the pixel array section 30 is provided at a lower end of the substrate end portion $70_D$ substantially corresponding to the pixel column over the width of the pixel array section 30 in the horizontal direction. Besides, since the distance between the folding region and the signal outputting circuit 60 is small, wiring lines of a peripheral circuit section cannot be laid.

From such a reason as just described, a space in which pad portions for fetching gate controlling signals, that is, the switch control signals $SEL_R$, $SEL_G$, $SEL_B$ and $GATE_{ofs}$ and the reference potential $V_{ofs}$ from the outside of the substrate are to be provided cannot be assured on the substrate end portion $70_D$. Accordingly, the pad portions $84_D$ and $84_E$ for fetching the gate controlling signals and the reference potential $V_{ofs}$ from the outside of the substrate to the signal outputting circuit 60 are provided at a location in the substrate end portion $70_D$ on the substrate end portion $70_D$ farther than the bent portion, that is, at the opposite end portions $70_{D1}$ and $70_{D2}$. In other words, by providing the pad portions $84_D$ and $84_E$ at the opposite end portions $70_{D1}$ and $70_{D2}$ of the substrate end portion $70_D$, even if the distance between the folding region and the signal outputting circuit 60 is small, the gate controlling signals and the reference potential $V_{ofs}$ can be provided with certainty from the outside of the substrate to the signal outputting circuit 60.

3. Modification

In the application described above, the disclosed technology is applied to the organic EL display apparatus $10_A$ which is configured such that the scanning circuit sections, that is, the writing scanning circuit 40 and the power supply scanning circuit 50, are provided in the display panel 70, particularly mounted on the substrate end portions $70_B$ and $70_G$. However, the disclosed technology is not limited to the application example described above.

Figure 19:
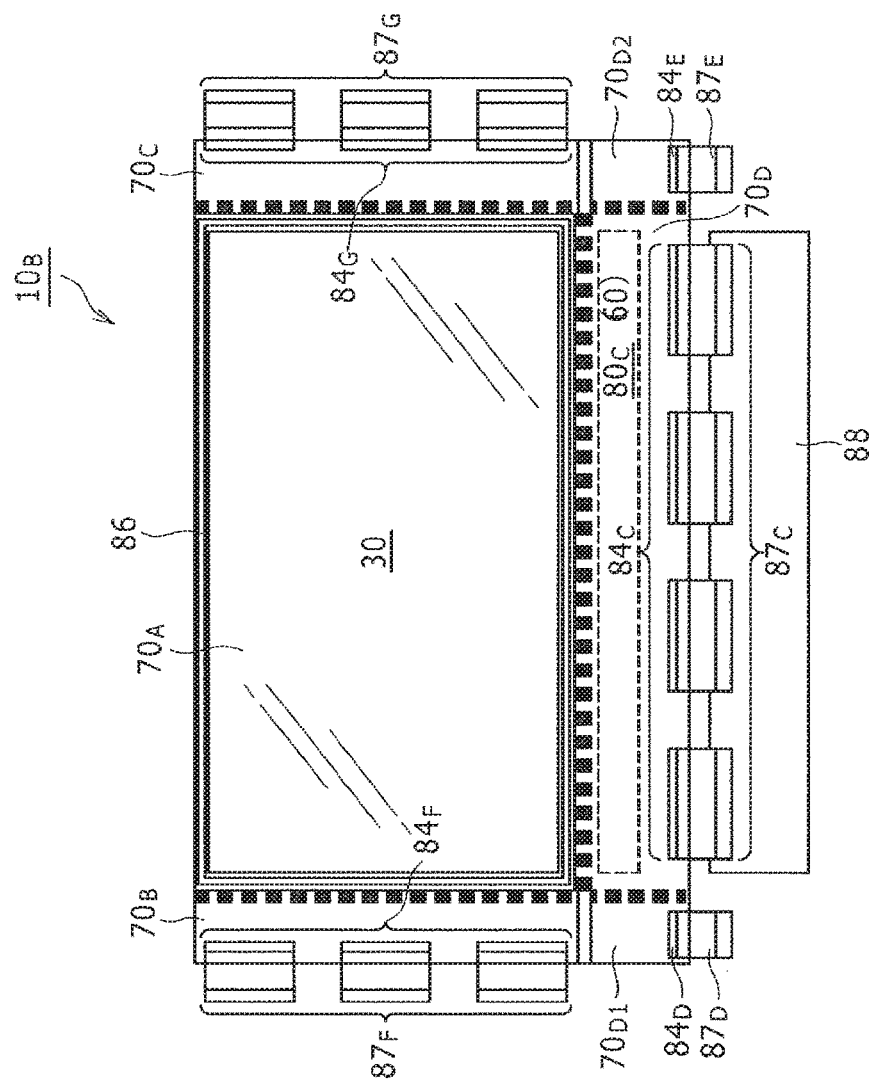
FIG. 19 is a similar view but showing an example of a configuration of electrical connection to the outside of the substrate in the case where the scanning circuit section is provided outside the panel.

In particular, the disclosed technology can be applied similarly also to an organic EL display apparatus $10_B$ which is configured such that, as seen in FIG. 19, the writing scanning circuit 40 and the power supply scanning circuit 50 are not built therein but external drivers are used. In this instance, pad portion groups $84_F$ and $84_G$ may be disposed on the substrate end portions $70_B$ and $70_G$ such that the pixel array section 30 and the outside of the substrate are electrically connected through the pad portion groups $84_F$ and $84_G$.

Further, while, in the application example described above, the disclosed technology is applied to an organic EL display apparatus which uses an organic EL element as an electro-optical element of the pixel 20, the disclosed technology is not limited to the application example. In particular, the disclosed technology can be applied to various display apparatus wherein elect-optical elements or light emitting elements such as inorganic EL elements, LED elements or semiconductor laser elements are used.

4. Electronic Apparatus

The display apparatus of the embodiment of the disclosed technology described above can be applied as a display apparatus for electronic apparatus in various fields wherein a video signal inputted to the electronic apparatus or a video signal generated in the electronic apparatus is displayed as an image or a picture. For example, the disclosed technology can be applied to such various electronic apparatus as shown in FIGS. 20 to 24A to 24G, for example, to a digital camera, a notebook type personal computer, a portable terminal apparatus such as a portable telephone set and a video camera.

In this manner, the display apparatus according to the embodiment of the disclosed technology can be used as a display apparatus in electronic apparatus in various fields. As apparent from the foregoing description of the embodiments, the display apparatus according to the embodiment of the disclosed technology can achieve further reduction of the width of the framework molding of the display panel without limiting the functions of the peripheral circuit sections for driving pixels of the pixel array section. Accordingly, if the display apparatus of the embodiment of the disclosed technology is used as the display apparatus in various electronic apparatus, then a compact form of the display apparatus can be achieved while the picture quality is maintained.

The display apparatus of the embodiment of the disclosed technology may be formed as of a module type wherein it is encapsulated. For example, the display apparatus may have a form of a display module wherein, for example, a transparent opposing member of glass or the like is pasted to the pixel array section 30. A color filter, a protective film or the like may be provided on the transparent opposing member. It is to be noted that, on the display module, a circuit section, an FPC (flexible printed circuit) or the like for inputting and outputting signals and so forth from the outside to the pixel array section and vice versa.

In the following, particular examples of an electronic apparatus to which the disclosed technology is applied are described.

Figure 20:
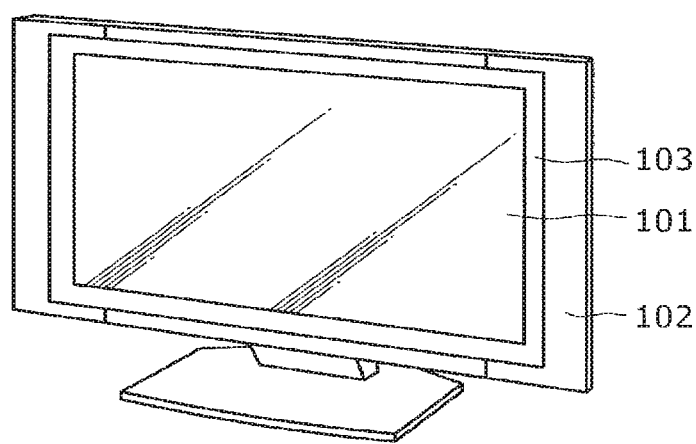
FIG. 20 is a perspective view showing an appearance of a television set to which the display apparatus of the disclosed is applied.

FIG. 20 shows an appearance of a television receiver to which the disclosed technology is applied. Referring to FIG. 20, the television receiver includes a video signal display face section 101 configured from a front panel 102, a filter glass plate 103 and so forth and is produced using the display apparatus of the embodiment of the disclosed technology as the video signal display face section 101.

Figure 21A:
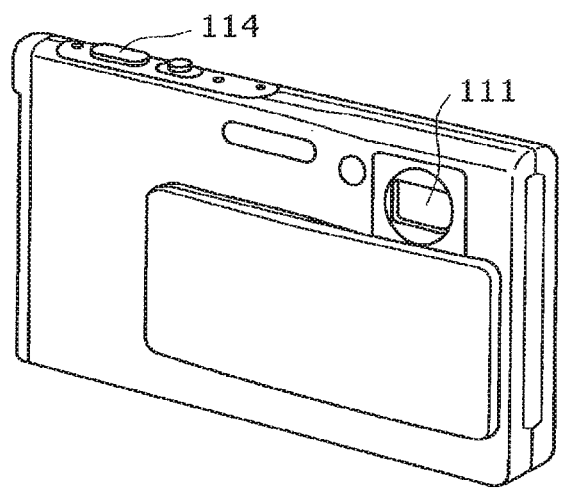
FIGS. 21A and 21B are perspective views showing an appearance of a digital camera, to which the display apparatus of the disclosed is applied, as viewed from the front side and the rear side, respectively.
Figure 21B:
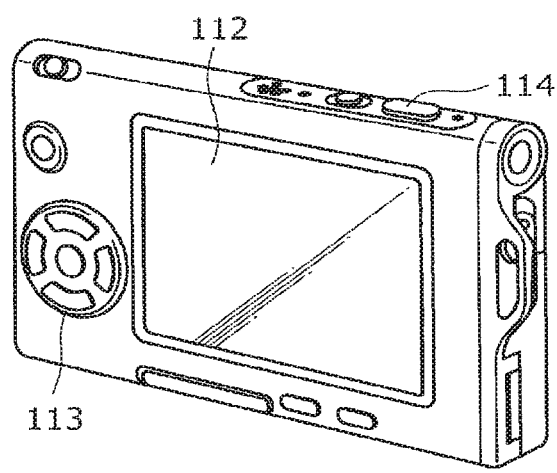

FIGS. 21A and 21B show an appearance of a digital camera to which the disclosed technology is applied as viewed from the front side and the rear side, respectively. Referring to FIGS. 21A and 21B, the digital camera shown includes a flash light emitting section 111, a display section 112, a menu switch 113, a shutter 114 and so forth. The digital camera is produced using the display apparatus of the embodiment of the disclosed technology as the display section 112.

Figure 22:
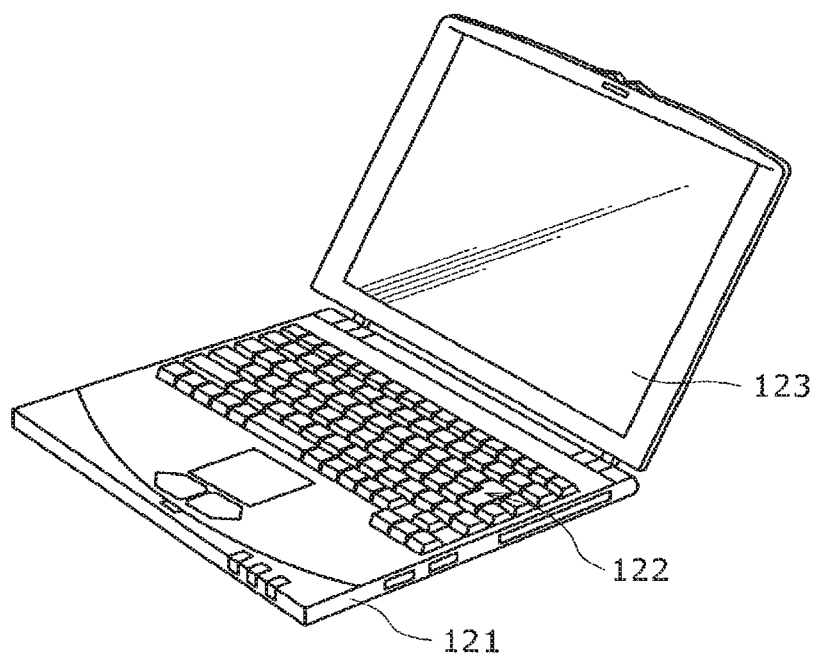
FIG. 22 is a perspective view showing an appearance of a notebook type personal computer to which the display apparatus of the disclosed is applied.

FIG. 22 shows an appearance of a notebook type personal computer to which the disclosed technology is applied. Referring to FIG. 22, the notebook type personal computer shown includes a body 121, a keyboard 122 for being operated in order to input characters and so forth, a display section 123 for displaying an image and so forth. The notebook type personal computer is produced using the display apparatus of the embodiment of the disclosed technology as the display section 123.

Figure 23:
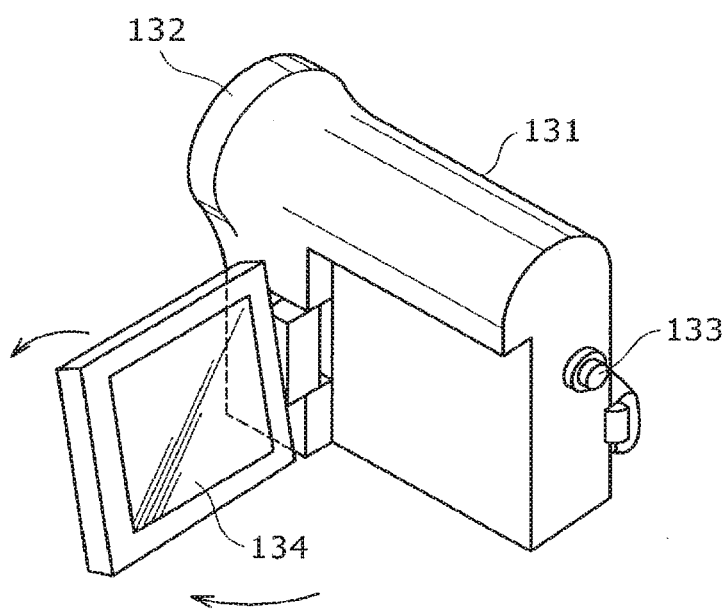
FIG. 23 is a perspective view showing an appearance of a video camera to which the display apparatus of the disclosed is applied.

FIG. 23 shows an appearance of a video camera to which the disclosed technology is applied. Referring to FIG. 23, the video camera shown includes a may body section 131, and a lens 132 provided on a side face directed forwardly for picking up an image of an image pickup object. The video camera further includes a start/stop switch 133 for image pickup, a display section 134 and so forth. The video camera is produced using the display apparatus of the embodiment of the disclosed technology as the display section 134.

FIGS. 24A to 24G show a portable terminal apparatus, as a portable telephone set, for example, to which the disclosed technology is applied. Referring to FIGS. 24A to 24G, the portable terminal apparatus includes an upper side housing 141, a lower side housing 142, a connection section 143 in the form of a hinge section, a display section 144, a sub display section 145, a picture light 146, a camera 147 and so forth. The portable telephone set is produced using the display apparatus of the embodiment of the disclosed technology as the display section 144 and/or the sub display section 145.

The present disclosure contains subject matter related to that disclosed in Japanese Priority Patent Application JP 2010-276940 filed in the Japan Patent Office on Dec. 13, 2010, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:
1. A display apparatus, comprising:
a foldable first substrate;
a pixel array including a plurality of pixels on a central portion of the first substrate, respective ones of the plurality of pixels comprising an electro-optical device;
a resin film on the pixel array;
a peripheral circuit on a peripheral portion of the first substrate and configured to drive the pixel array;
pads on the peripheral portion of the first substrate and connected to the peripheral circuit;
a circuit section configured to drive the electro-optical device and including a circuit element formed on the first substrate;
a flattening film and a window insulation film laminated on the circuit element; and
a second substrate disposed above the flattening film and the window insulation film in a region of the first substrate other than the peripheral portion of the first substrate and a folding portion of the peripheral portion of the first substrate, wherein the first substrate is folded such that the peripheral portion of the first substrate partially overlaps the central portion of the foldable substrate, and the peripheral circuit and the pads are disposed under the pixel array.

2. The display apparatus according to claim 1, wherein the pads are provided at a location on the peripheral portion of the foldable substrate, on which the peripheral circuit is provided, farther than the folding portion.

3. The display apparatus according to claim 2, wherein a groove configured to prevent water invasion is formed in a side of the pixel array with respect to the folding portion in such a manner as to surround the pixel array.

4. The display apparatus according to claim 3, wherein the groove is formed along a side of the peripheral circuit with respect to the folding portion in such a manner as to surround the peripheral circuit.

* * * * *